United States Patent [19]
Takagi et al.

[11] Patent Number: 5,895,996
[45] Date of Patent: Apr. 20, 1999

[54] SAW DEVICE

[75] Inventors: Michiaki Takagi; Eishi Momosaki; Yoshinori Ikusaka, all of Suwa, Japan

[73] Assignee: Seiko Epson Corporation, Tokyo, Japan

[21] Appl. No.: 08/647,921

[22] PCT Filed: Feb. 28, 1995

[86] PCT No.: PCT/JP95/00312

§ 371 Date: May 29, 1996

§ 102(e) Date: May 29, 1996

[87] PCT Pub. No.: WO96/10293

PCT Pub. Date: Apr. 4, 1996

[30] Foreign Application Priority Data

Sep. 29, 1994 [JP] Japan ................ 6-235210
Oct. 21, 1994 [JP] Japan ................ 6-256871
Nov. 11, 1994 [JP] Japan ................ 6-277503

[51] Int. Cl.$^6$ ................................... H01L 41/08
[52] U.S. Cl. .................. 310/313 R; 310/313 A; 310/361; 310/316
[58] Field of Search ............. 310/313 R, 313 D, 310/313 B, 361, 313 A, 316

[56] References Cited

U.S. PATENT DOCUMENTS

| | | | |
|---|---|---|---|
| 4,398,115 | 8/1983 | Gagnepain et al. | 310/313 A |
| 4,542,356 | 9/1985 | Nakazawa et al. | 333/195 |

FOREIGN PATENT DOCUMENTS

| | | |
|---|---|---|
| 57-11819 | 1/1982 | Japan . |
| 57-5418 | 1/1982 | Japan . |
| 57-73513 | 5/1982 | Japan . |
| 61-199926 | 12/1986 | Japan . |
| 63-54010 | 3/1988 | Japan . |
| 63-82115 | 4/1988 | Japan . |
| 63-184411 | 7/1988 | Japan . |
| 2-244812 | 9/1990 | Japan . |
| 3-27702 | 1/1991 | Japan . |
| 3-261210 | 11/1991 | Japan . |
| 4-265009 | 9/1992 | Japan . |
| 4-289109 | 9/1992 | Japan . |
| 5-160665 | 6/1993 | Japan . |

Primary Examiner—Mark O. Budd
Assistant Examiner—Timothy A. Williams
Attorney, Agent, or Firm—Oliff & Berridge, PLC

[57] ABSTRACT

A SAW device utilizing elastic surface waves, in which the Q value indicating resonance sharpness is high, and which presents excellent frequency temperature characteristics and short-term frequency stability. In a SAW device according to the present invention, an IDT and two reflectors are in parallel in the propagation direction of the phase of the elastic surface waves. The IDT and reflectors are disposed to cover the power flow direction, which is the propagation direction of energy of the elastic surface waves, whereby the energy of the elastic surface waves is efficiently confined. Moreover, it becomes possible to manufacture the SAW device utilizing a piezoelectric crystal in which angle $\theta$ and angle $\psi$ indicating excellent frequency temperature characteristics are 25 to 45 degrees and 40 to 47 degrees, respectively. It is also possible to manufacture the SAW device utilizing a piezoelectric crystal where angle $\psi$ is related to angle $\theta$ such that $\theta = 2.775 \times (\psi - 32.5) + 6.5$ where angle $\theta$ is in the range of 4 to 7 degrees.

34 Claims, 19 Drawing Sheets

SAW DEVICE

TECHNICAL FIELD

The present invention relates to a device utilizing elastic surface waves (referred to as SAW (Surface Acoustic Waves) hereinafter), and it particularly relates to a SAW resonator which can generate a high-frequency range in a stable manner.

BACKGROUND ART

As for construction of a SAW resonator where there is provided a fingers-interleaved electrode (referred to as IDT (Interdigital transducer)) on the surface of a piezoelectric plate such as a quartz piece and a reflector disposed at both ends of this IDT, for example, U.S. Pat. No. 471,616 Official Gazette and U.S. Pat. No. 3,886,504 Official Gazette disclose such construction.

As the piezoelectric plate constituting the SAW resonator, a so-called ST-cut SAW resonator is known which utilizes a crystal ST cut and an X axis thereof serves as the propagating direction of the elastic wave. In this ST cut SAW resonator the zero temperature coefficient that is a primary coefficient $\alpha$ for the frequency temperature characteristic becomes 0, thus being excellent in frequency stability.

Conventionally, the SAW device has been used as a SAW filter, which is a filter for use with high frequency, so that not so high a Q-value is required. However, in recent years, in a SAW resonator constituting an oscillator for the use, it is important that a further stable resonance frequency be obtained and it is required to provide the resonator with a favorable temperature characteristics and high Q value. Moreover, the primary temperature coefficient $\alpha$ for the ST cut SAW resonator is almost 0, while the secondary temperature coefficient $\beta$ is relatively large i.e. $-3.4 \times 10^{-8}/°C^2$. Thus, the frequency change of approximately 110 ppm will be generated in the temperature range of $-20°$ C. through $80°$ C. which is an operating temperature range of the SAW resonator. Therefore, under usage with the mobile communication, etc., it is necessary to provide a SAW resonator having further stable temperature characteristics in order to generate the high frequency precisely.

SUMMARY OF THE INVENTION

In the ST cut SAW resonators and the like, it is an object of the present invention to provide a SAW resonator having a high Q value without deteriorating the excellent frequency temperature characteristics. In order to achieve this object, the SAW resonator of the present invention is configured such that an IDT and a reflector disposed at both sides thereof confine the energy of elastic surface waves. Moreover, the IDT and reflector are disposed so that they cover also the progressing direction of the energy together with the progressing direction of the phase of the elastic surface waves on the piezoelectric material, whereby the energy of the elastic surface waves are further efficiently confined.

Moreover, it is another object of the present invention to further improve the frequency temperature characteristics together with the improvement of the Q value. In order to achieve another object, a cutting orientation is found such that a secondary coefficient $\beta$ can be reduced while a primary coefficient $\alpha$ becomes zero, and the energy of the elastic surface waves is efficiently confined by utilizing the crystal piece having this cutting orientation, whereby there can be provided a SAW resonator in which the Q value is high and the frequency deviation is small in the range of the operating temperatures.

Moreover, in recent years, Ouhara et al. announced a crystal K cut which excels the ST cut in the short-term frequency stability by a factor of 1–2 digit(s) in the U.S. FCS (Frequency Control Symposium, June 1994) and Japanese Electric Academic Society Electronics Circuit Research Session (The Institute of Electrical Engineers of Japan, Sep. 8, 1994). As the crystal K cut, an angle in the vicinity of ($\phi$, $\mu$, $\nu$)=(0., 96.51, 33.79) (degree) expressed by the Euler angle in the orthogonal coordinate system, is suggested. However, though this cut angle is said to present superior heat resistant shock characteristics, whether or not the frequency temperature characteristics can be used in the operating temperatures has not been confirmed. Therefore, it is the object of the present invention to find out an angle, in the vicinity of this cut angle, which is excellent in the temperature characteristics and to provide a SAW resonator having a high Q value.

DESCRIPTION OF PREFERRED EMBODIMENTS

Figure 1:
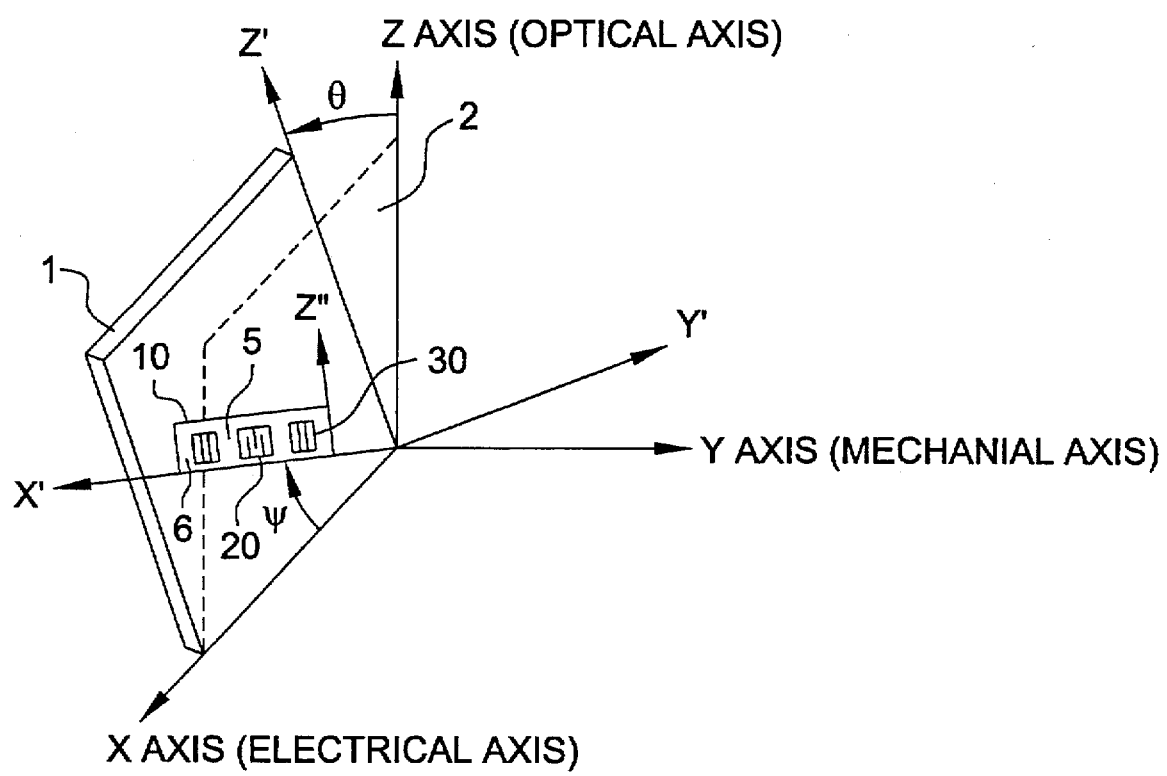
FIG. 1 is a conceptual diagram showing the orientation of a SAW resonator according to the present invention.

The present invention will be described hereinafter in detail by taking an example of a SAW resonator which adapts a crystal piece cut from an α quartz single crystal (right crystal) as a piezoelectric plate. As for a left crystal, the following argument will be identical by complying with the left orthogonal coordinate system. FIG. 1 shows the orientation of a wafer 1 which will be a base material of a crystal piece 5 used in the present invention. The wafer 1 is equipped with a plane obtained by rotating a so-called Y plate 2, normal to a Y axis that is a mechanical axis of the crystal, about an electric axis X of the crystal in the counterclockwise direction at an angle of θ degree. Then, a Y' axis and a Z' axis are specified which are rotated by θ degree from the mechanical axis Y and the optical axis Z of the crystal, respectively, relative to the above rotated plane. An IDT 20 and reflector 30 constituting the SAW resonator is disposed along the X' axis where the electric axis X of the crystal is rotated about the Y' axis by ±ψ degree while the counterclockwise direction is treated as positive. The crystal piece 5 constituting the SAW resonator 10 is cut such that it has a main surface 6 specified by a Z" axis obtained by rotating the Z' axis at ±ψ degree from the wafer 1 and X' axis.

When angles θ and ψ are expressed by the Euler angle, they will be (0, θ+90°, ψ). The sign of the angle is such that the counterclockwise direction is treated as positive (+). As for the value of angle ψ, the characteristics thereof indicated at the both cases of being rotated in the + direction and − direction will be the same. In other words, the + direction is symmetric to the − direction, and the value of angle ψ indicated hereinbelow can be formed in either directions.

Configuration of IDT and reflector

Figure 2:
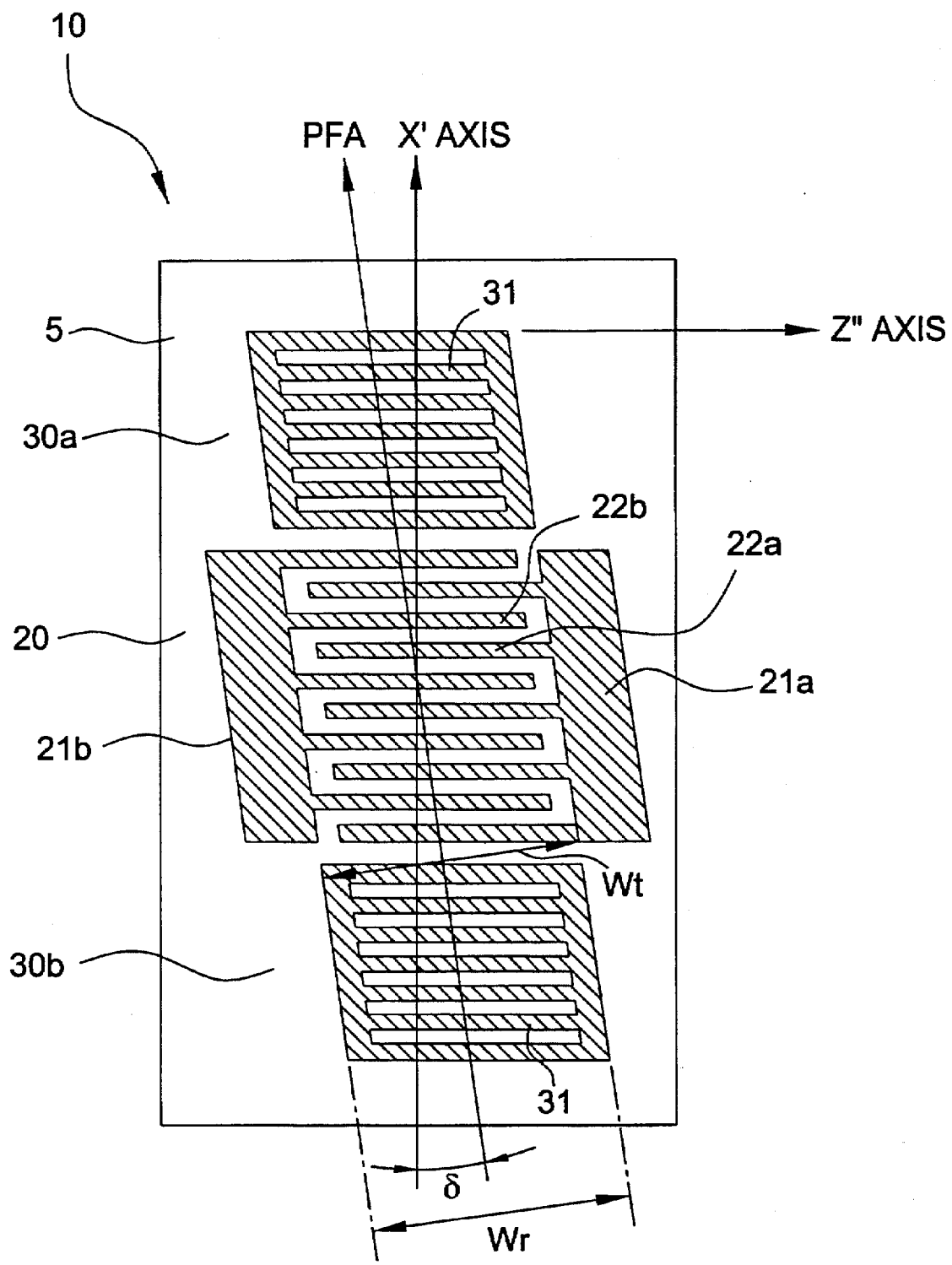
FIG. 2 is a plan view showing a configuration for the SAW resonator of a single port type according to the present invention.
Figure 3:
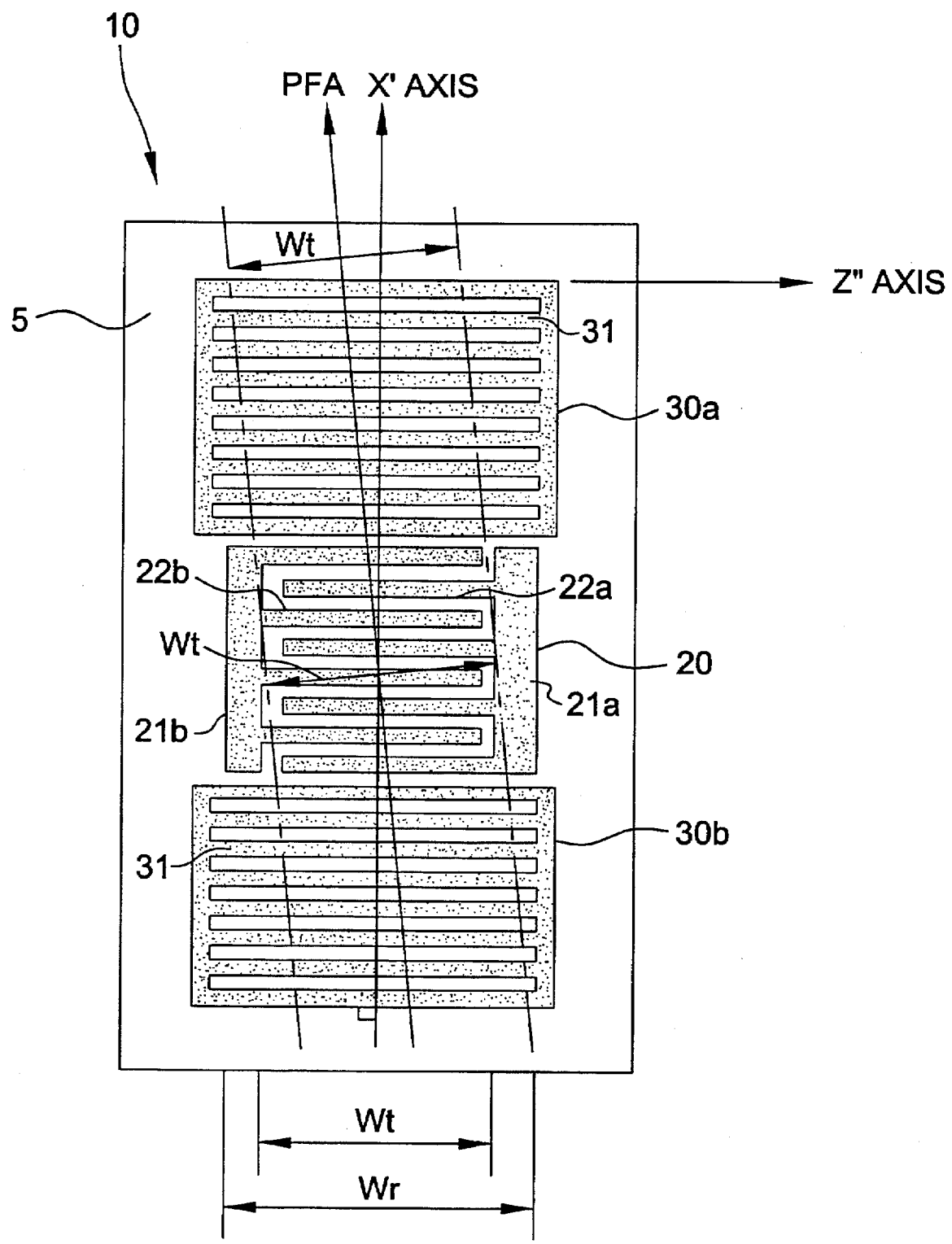
FIG. 3 is a plane view showing a configuration for a different example of the single-port type SAW resonator according to the present invention.

FIG. 2 and FIG. 3 show the configurations of interleaved electrodes (IDT) and reflector 30 according to the present invention. The IDT 20 are equipped with a pair of electrodes 21a and 21b disposed counter to each other. M pairs of interleaved electrodes 22a and 22b are extended from respective electrodes 21a and 21b in the shape of a comb. These interleaved electrodes 22a and 22b are configured in a parallel line at a pitch Pt and normal to the X' axis. At the both sides along the X' axis of the IDT, a pair of reflectors 30a and 30b are configured with a space g therebetween (see FIG. 7). Respective reflectors 30a and 30b are comprised of a plurality of conductor strips 31 arranged in a parallel line at a pitch Pr and normal to the X' axis. The electrodes 22 and conductor strips 31 are such that a conductive metal film such as Al, Au or Cu is formed in the form of a thin film on the plate 5 of the crystal by means of vapor deposition, sputtering, etc. and is pattern-formed by a photo lithography technique, so as to be easily produced including a microscopic pattern.

In the SAW resonator 10 according to the present invention, an energy confining type is adapted for the configuration of the IDT 20 and reflectors 30a, 30b. Moreover, the electrodes 22 and conductor strips 31 are provided in such a position that they cover a power flow direction toward which the energy propagates, against the direction orthogonal to the IDT 20, that is, X' axis (with angle ψ) which is the progressing direction of the phase of the elastic surface waves.

The concept of the energy confining type is introduced in an article "Energy confining elastic surface wave resonator" in the Shingaku-Gihou (THE INSTITUTE OF ELECTRONICS, INFORMATION AND COMMUNICATION ENGINEERS TECHNICAL REPORT IEICE, JAPAN) US87-36 (pp9–16 (issued in September, 1987)). In the SAW resonator of the example according to the present invention, the total reflection coefficient Γ of the IDT 20 is defined in the following manner, and its value is set to the range of approximately 0.8–10.

$$\Gamma = 4MaH/\lambda \tag{1}$$

where M is the number of pairs of the IDT's interleaved electrodes, a is the reflection coefficient of elastic surface wave per a single electrode 22, H is the film thickness of the conductor constituting the electrode 22 and λ is a wavelength of the elastic surface waves. In the case where an ST cut crystal plate is utilized as piezoelectric material's plate 5 and the aluminum (Al) constitutes the electrode 22, and if a is 0.255, H/λ is 0.03, and M is 80, then a single port SAW resonator can be constructed having a resonance frequency of 150–170 MHz. Then, Γ is in the level of 2.448.

Figure 4:
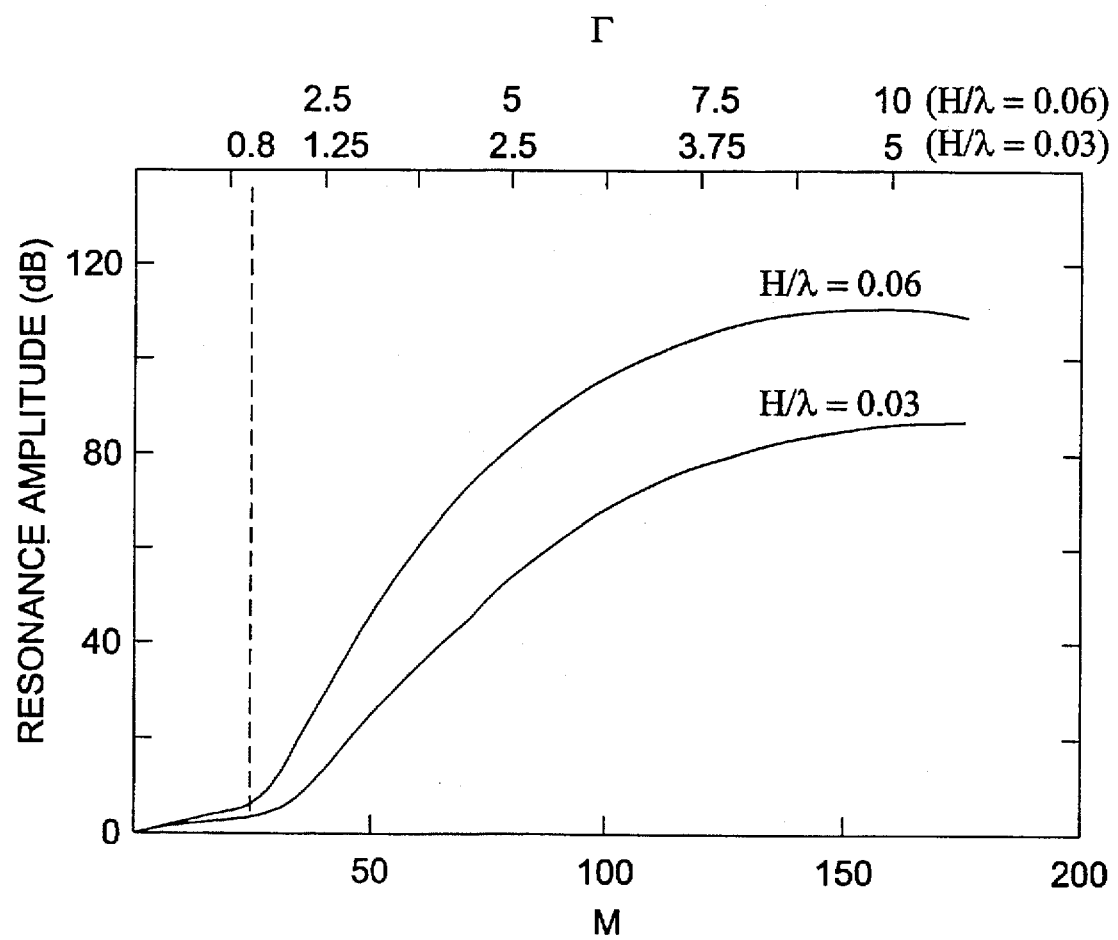
FIG. 4 is a graph showing the correlation between the total reflection coefficient $\Gamma$ and resonance amplitude.

FIG. 4 shows the change of resonance amplitude of the SAW resonator when the total reflection coefficient Γ is controlled with the M pairs being a variable in the single port SAW resonator. The number of the conductor strips in the reflector is set to 2M. Referring to FIG. 4, it is observed that the amplitude rises up from a point where Γ is about 0.8 showing that it can be used as a resonator. On the other hand, when the ratio H/λ of the electrode film thickness over the elastic surface waves' wavelength is increased in order to increase the total reflection coefficient Γ, the resonance amplitude will indicate the maximum value since a viscosity loss exists in the electrode film, and will be gradually reduced thereafter. In FIG. 4, it is observed that the resonance amplitude starts to decline from a point where Γ is in the level of 10, and M is approximately 160 then. Therefore, as long as Γ is in the range of approximately 0.8–10, the energy confining effect due to the IDT interleaved electrodes can be obtained, so that a characteristic-stable resonator can be obtained.

Figure 5:
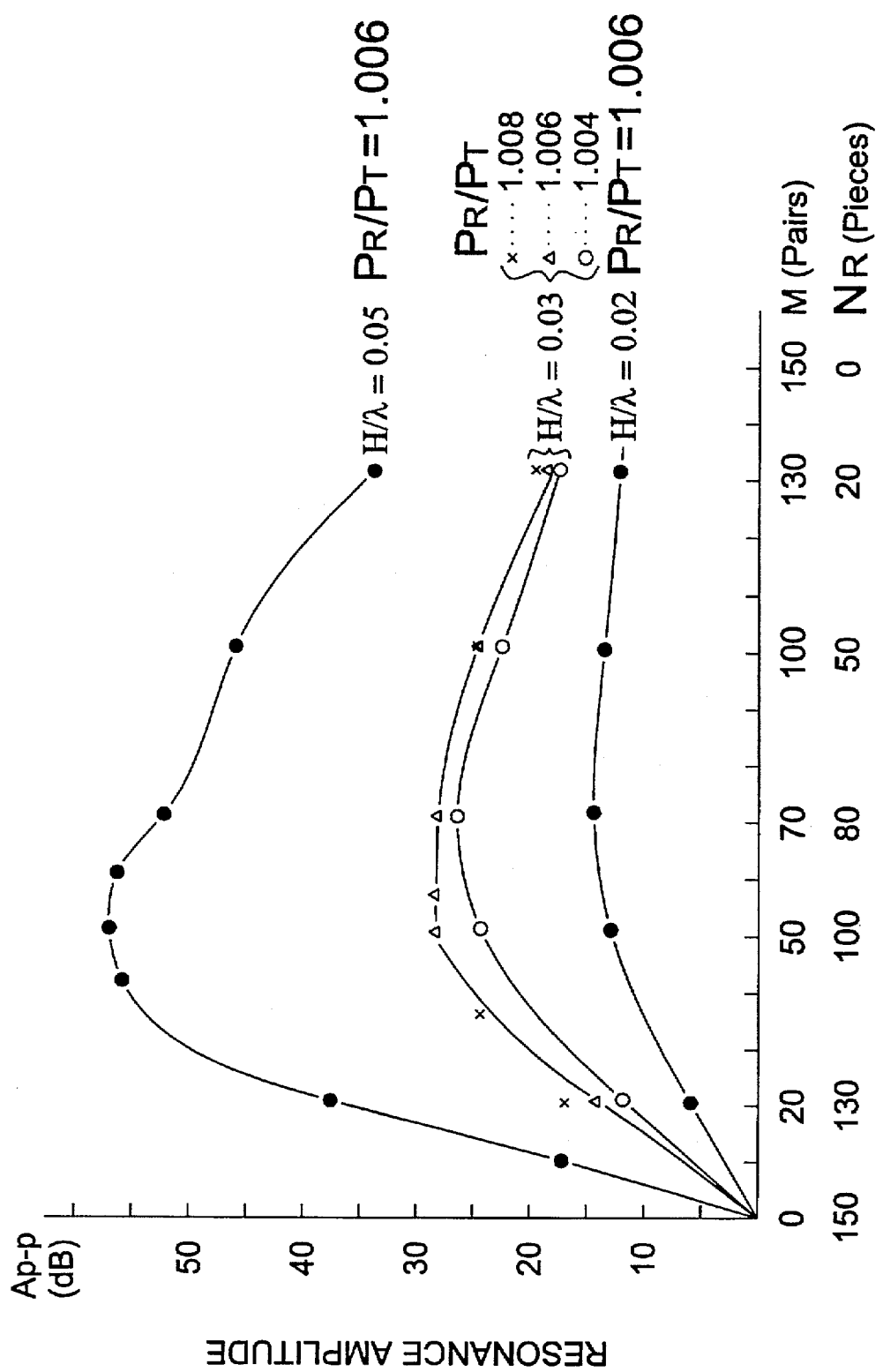
FIG. 5 is a graph showing the correlation between the ratio of a film thickness H of the electrode and the wavelength $\lambda$ of the elastic surface wave, and the resonance amplitude.

FIG. 5 shows a result after measuring the correlation between the electrode film thickness and the maximum value of the resonance level (peak-to-peak level App.) when the sum of the number of pairs of the electrodes M and the total number of reflector's conductors Nr are fixed at 150, and the number of pairs of electrodes M is varied within this ranges. As evident from FIG. 5, the maximum value of the resonance level increases as H/λ increases from 0.02 to 0.05. However, as the ratio H/λ of the electrode film thickness and frequency approaches 0.06, the resonance level is decreased because the acoustic speed of the surface waves is decreased so as to give rise to the viscosity. Therefore, it is desirable that H/λ is in the range of 0.02–0.06. In order that the number of pairs of electrodes M covers up to the level of 300 it is further desirable that H/λ is in the level of 0.02–0.04 since the increase of the number of pairs of electrodes M increases the above-mentioned total reflection coefficient Γ.

Moreover, referring to FIG. 5, it is observed that the optimum resonance amplitude is obtained when the ratio Nr/M of the number of pairs of electrodes M and the number Nr of reflector's conductor strips is 1.5–2.0.

The energy confining effect due to the reflector is improved in addition to the energy confining effect in the IDT itself in a manner that the central frequency of the radiation conductance in the IDT approximately matches the reflection central frequency of the reflector. As a result, the resonance sharpness of the SAW resonator can be improved and there can be provided a SAW resonator having a high Q value.

Figure 6:
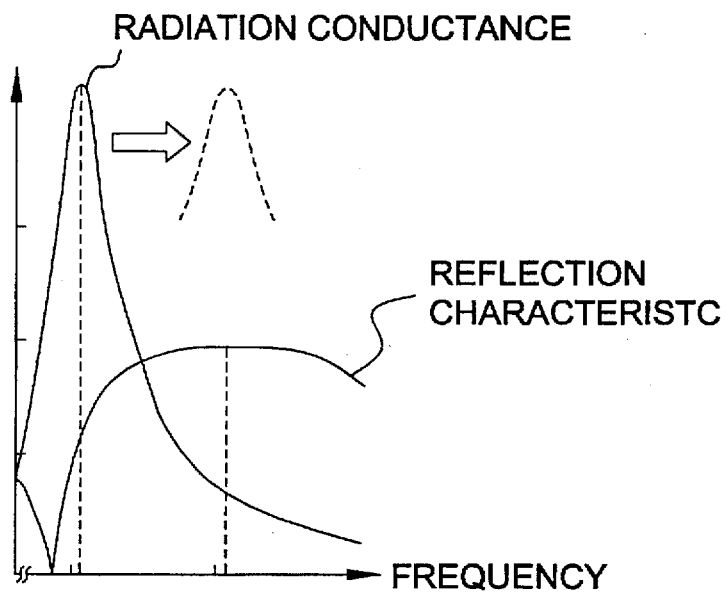
FIG. 6 is a graph showing the correlation of the central frequency of the IDT's radiation conductance and the central frequency of the reflector's reflection characteristic.

FIG. 6 illustrates an outline of the IDT's radiation conductance characteristic and the reflector's reflection characteristic. As shown in bold lines in FIG. 6, when the pitch Pt of the IDT's interleaved electrodes is the same as the pitch Pr of the reflector's conductor, the central frequency of the radiation conductance where the amplitude becomes a peak value among frequencies of excitable elastic surface waves in the IDT is slightly lower than the reflection central frequency of the reflector. Thereby, in this example, the ratio Pr/Pt of the pitch of the IDT and the pitch Pr of the reflector is set slightly high so that these central frequencies are approximately matched. Consistently, the excitation of the elastic surface waves in the IDT is efficiently performed and the maximum of the resonator's oscillation displacement lies in the center of the IDT, so that the resonator of a high energy confinement type can be realized having a high Q value. In the SAW resonator of this example, Pr/Pt is set to the level of 1.004–1.008 so as to improve the energy confining effect, as shown in FIG. 5.

Figure 7:
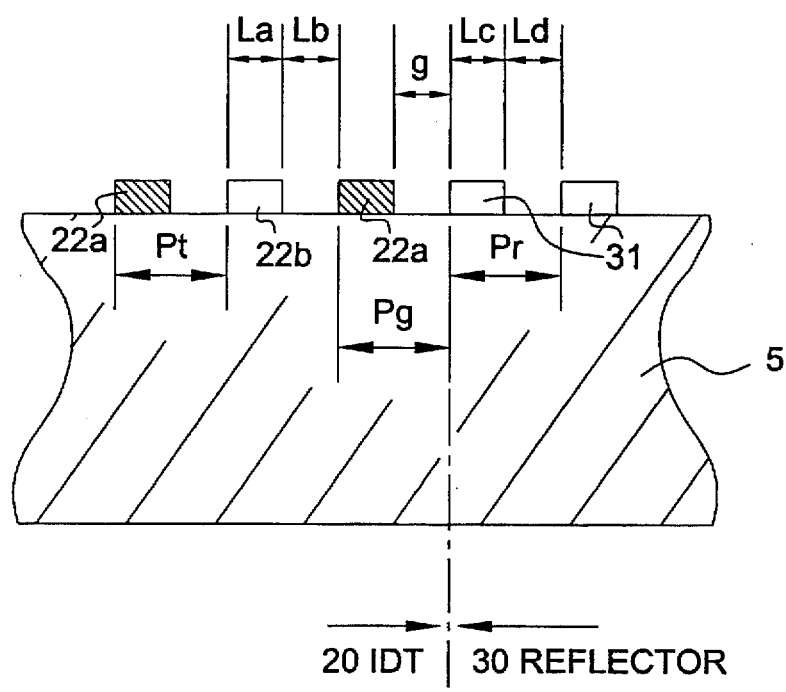
FIG. 7 is a cross sectional view showing the configuration of the IDT's interleaved electrodes, the configuration of the reflector's conductor strips, and the space between the IDT and reflector.

Referring now to FIG. 7, the space g between the IDT and reflector whose pitch differs from each other is set so that it matches the space Lb of the IDT's pitch Pt in order to suppress the generation of the spurious oscillation in the longitudinal mode. FIG. 7 is an enlarged cross sectional view showing a portion in which the reflector 30 is positioned adjacent to the IDT 20. In the reflector 30, the conductor strips 31 are disposed at a pitch Pr, and the width Lc of the conductor strip 31 and the space Ld between the strips are each set to the approximately same value so as to obtain high a reflection factor. In the IDT 20, the interleaved electrodes 22a and 22b are alternately disposed at a pitch Pt, and the width La of the electrode and the space Lb between the electrodes are also each set to the approximately same value or are set such that La is slightly larger than Lb. Moreover, the space g between the electrode of the IDT 20 at the reflector 30 side and the conductor strip of the reflector 30 at the IDT 20 side are set to the same value as the space Lb between the electrodes, and the conductor strips of the reflector 30 at the IDT 20 side are arranged at a pitch Pr.

Figure 8:
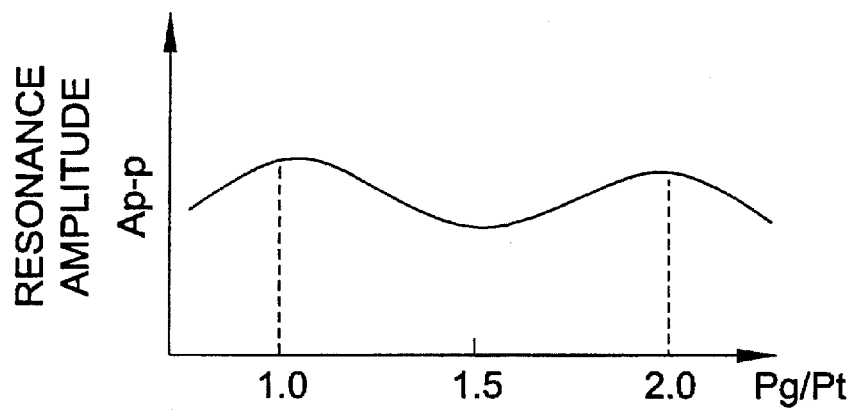
FIG. 8 is a graph showing the correlation between the space between the IDT and reflector, and the resonance amplitude.

FIG. 8 shows the influence of a change in the space g upon the resonance level. In FIG. 8, the space g is expressed by a pitch Pg of the electrode in the IDT which lies closest to the reflector side, and the resonance level is measured by varying the ratio Pg/Pt. Evident from FIG. 8, it is desirable that the pitch of the space between the IDT and reflector shall be kept at the same value, and the resonance level will deteriorate if this pitch is shifted to induce the spurious oscillation.

Accordingly, by placing the IDT 20 and reflector 30 on the crystal piece serving as the piezoelectric material, there can be obtained a SAW resonator having a large Q value indicating the resonance sharpness. Moreover, in the SAW resonator 10 of this example, the interleaved electrodes 22 and the conductor strips 31 of the reflector are disposed so as to cover a power flow direction.

In the SAW resonator shown in FIG. 2, a power flow angle PFA, which is an energy propagating direction against the X' axis that is a propagation direction of the phase of the elastic surface waves, is not zero in the most of piezoelectric plates cut out of anisotropic piezoelectric crystals. This can be applied to not only the Rayleigh waves but also the leaky waves. As for the SAW filter, the power flow direction is made identical to the propagation direction of the phase of the elastic surface waves. Namely, it is known that the characteristics are improved by setting the PFA to zero. However, it is not necessarily guaranteed that the piezoelectric plates cut out in a direction where the power flow angle PFA is zero serves well as the SAW resonator in terms of the temperature characteristics and the frequency stability. Thus, at present, as the SAW resonator it is difficult to match the power flow angle PFA with the propagation direction of the phase. Therefore, in this example shown in FIG. 2, the electrodes 22 and conductor strips 31 extended in the parallel direction orthogonal to the propagation direction of the phase of the elastic surface waves are parallel-translated against the Z" axis, and the thus arranged direction is inclined by an angle δ from the X' axis so as to be arranged toward the direction of the power flow angle PFA. Or, as shown in FIG. 3, the width thereof is widened so as to also cover the direction of the power flow angle PFA Accordingly, by covering the power flow direction by the electrodes 22 and the conductor strips 31 of the reflector, the excitation energy of the IDT is confined further efficiently. Thus, there can be provided a SAW resonator having a further high Q value.

Firstly, it will be described why the energy confining effect is obtained along the power flow direction as in the SAW resonator of this example even though the power flow angle PFA does not match the propagation direction of the phase of the elastic surface waves. As a basic characteristic of a power flow vector $P_i$ (i=1, 2, 3), if $P_i$ is defined as a forward propagating vector in a particular direction, a backward propagating vector can be expressed by $-P_i$. This can be proved in the following manner.

$$2P_j = k\omega A^2 C_{sj} C_{pk} C_{ijkl} \{(l_1 - n_p d_1) \times U/w + \xi_p \times V/w\} \qquad (2)$$

where $U = (\xi_s + \xi_p) \cos(\theta_{sj} - \theta_{pk}) - (n_p - n_s) \sin(\theta_{sj} - \theta_{pk})$ $V = (\xi_s + \xi_p) \sin(\theta_{sj} - \theta_{pk}) + (n_p - n_s) \cos(\theta_{sj} - \theta_{pk})$ $W = (\xi_s + \xi_p)^2 + (n_p - n_s)^2$ Moreover, $l_1$ is a propagating-direction vector, $d_1$ is a damping-direction vector, $\xi_j + jn_j$ is a damping factor (j being an imaginary number unit), $C_{ij}$ and $\theta_{ij}$ are amplitude constants, ω is an angular frequency, A is a given amplitude constant, $C_{ijkL}$ is an elastic constant (i, j, k, l being 1, 2 or 3), and k is a wave number.

In the above equation (2), when the propagating direction of the elastic surface waves is changed from $-l_1$ to $-l_1$, i.e. when changed from the forward direction to the backward direction, it is proved that $\xi_i + jn_i$ becomes $\xi_i - jn_i$ or $\theta_{ij}$ as described by the inventor of this application at the Electronics Communication Academic Society Shin-etsu Branch Convention 1972 (Sinetu Section of IECE Japan). Therefore, when the propagating direction of the elastic surface waves becomes the opposite direction, the power flow vector becomes $-P_i$.

In the SAW resonator 110 shown in FIG. 2, the interleaved electrodes 22a, 22b of the IDT 20 are arranged in the parallel direction orthogonal to the propagation direction X' axis of the phase of the elastic surface waves. The arrangement direction of these electrodes is inclined by the angle δ against the X' axis and the electrodes are arranged along the power flow angle PFA. Moreover, the reflectors 30a, 30b disposed at both sides of the IDT 20 are also arranged with the angle δ inclined against the IDT 20, and are arranged along the power flow angle PFA. Moreover, the conductor strips 31 constituting respective reflectors 30a, 30b, are also arranged in the parallel direction orthogonal to the propagation direction X' axis of the phase of the elastic surface waves. The arrangement direction of these strips is inclined by the angle δ against the X' axis, and the strips are arranged along the power flow angle PFA. Therefore, as indicated according to the above equation (2), the energy of the elastic surface waves propagating along the power flow angle PFA travels back and forth between the IDT 20 and reflectors 30a and 30b along the power flow angle PFA without being leaked out from the both sides thereof, so as to generate the resonance phenomenon. As a result, the oscillation energy loss is extremely small and the Q value of the SAW resonator can be made large. In the SAW resonator of this example, it is desirable that the width Wr of the reflectors 30a, 30b orthogonal to the PFA axis is equal to or greater than the width Wt of the IDT 20 orthogonal to the PFA axis so as to minimize the energy loss from the reflectors.

It is most desirable that the IDT 20, reflectors 30a, 30b and the electrodes 22 and conductor strips 31 constituting the IDT and reflectors are arranged along the power flow angle PFA as shown in FIG. 2. However, by inclining the arrangement even slightly against the propagation direction of the phase, i.e., by inclining it to the power flow angle PFA direction by a nonzero angle δ, the oscillation energy can be confined efficiently compared to the SAW resonator in which the IDT and reflectors are arranged in the X' axis direction. Therefore, by changing the arrangement of these elements, the improvement in the Q value of the SAW resonator can be expected.

FIG. 3 shows an example of the SAW resonator of a type which confines the energy propagating along the power flow angle PFA, where the reflectors 30a, 30b are arranged relative to the IDT 20 along the propagation direction X' axis of the phase of the elastic surface waves, and the width wr of the reflectors 30a, 30b orthogonal to the X' axis is provided. In the SAW resonator 10 of this example, the broad reflectors 30a, 30b whose width is wr are disposed at both sides of the IDT 20 while the width of the IDT 20 orthogonal to the X' axis is wt. The width wr of the reflector is selected so that the width wt can be secured along the power flow angle PFA in the direction orthogonal to the power flow angle PFA. The most of the energy of the elastic surface waves propagating in the direction from the IDT 20 to the power flow angle PFA is reflected by the reflectors 30a, 30b, so that the energy resonance state similar to the above-described SAW resonator can be generated. Though in the SAW resonator of this example the IDT and reflectors are arranged in the propagation direction of the phase in the same manner as the conventional practice and the electrodes 22 and conductor strips 31 constituting the IDT and reflectors are arranged in the propagation direction of the phase, broadening the width of the reflector can realize to improve the energy confining effect and to obtain a high Q value.

Figure 9:
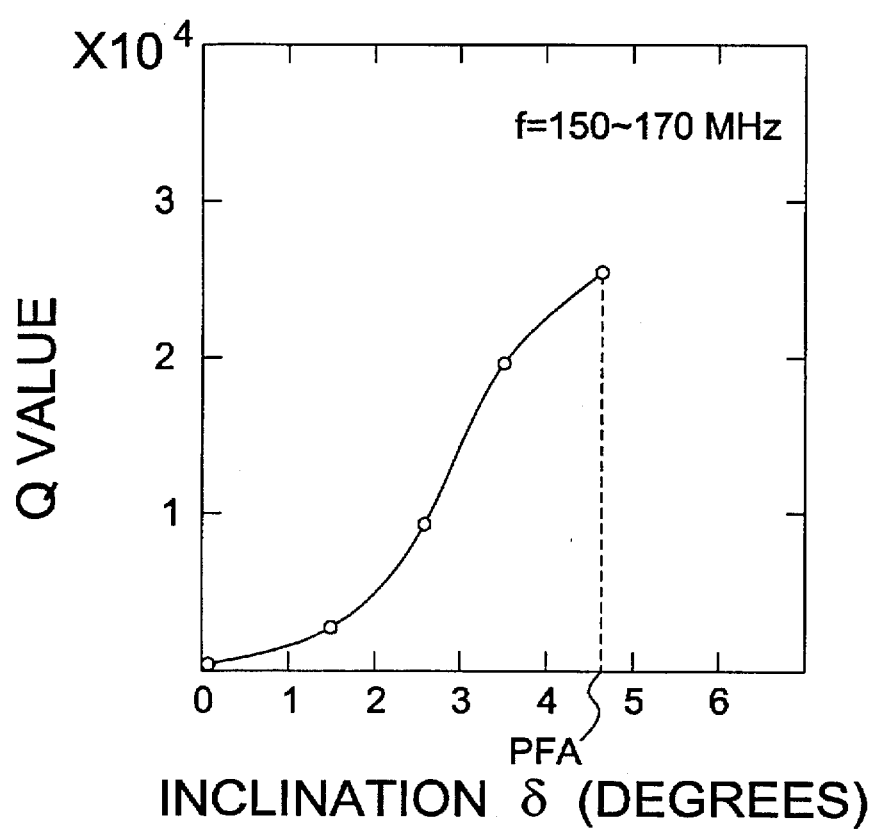
FIG. 9 is a graph showing the correlation between the Q value and angle $\delta$ where the angle $\delta$ denotes the angle when the position of the IDT and reflector is tilted by an angle of $\delta$.
Figure 10:
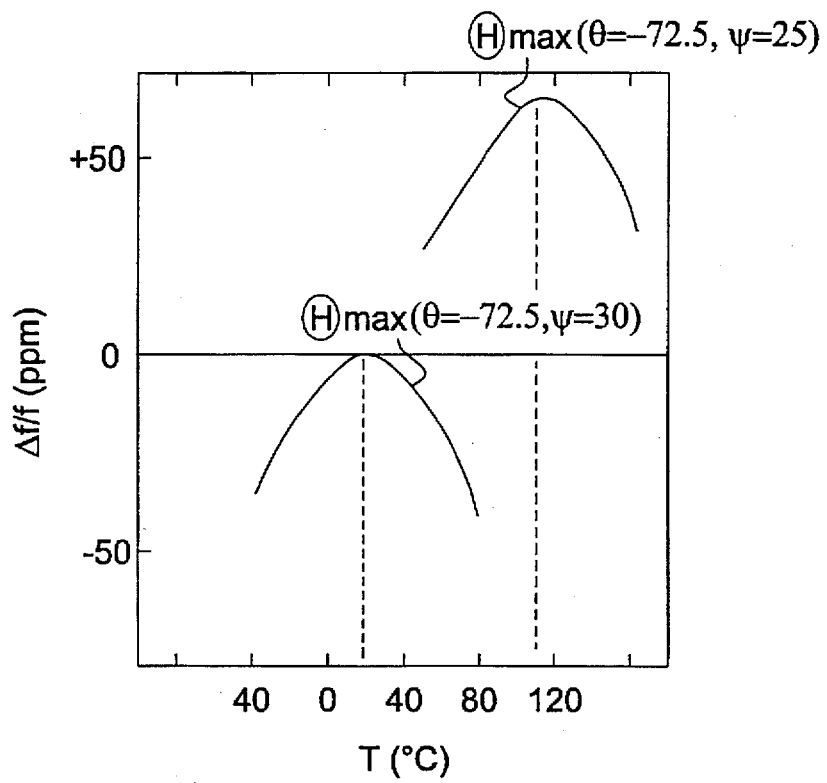
FIG. 10 is a graph showing the frequency temperature characteristics when the angle $\theta$ is $-72.5$ degrees and when the angles $\psi$ are 25 and 30 degrees.
Figure 11:
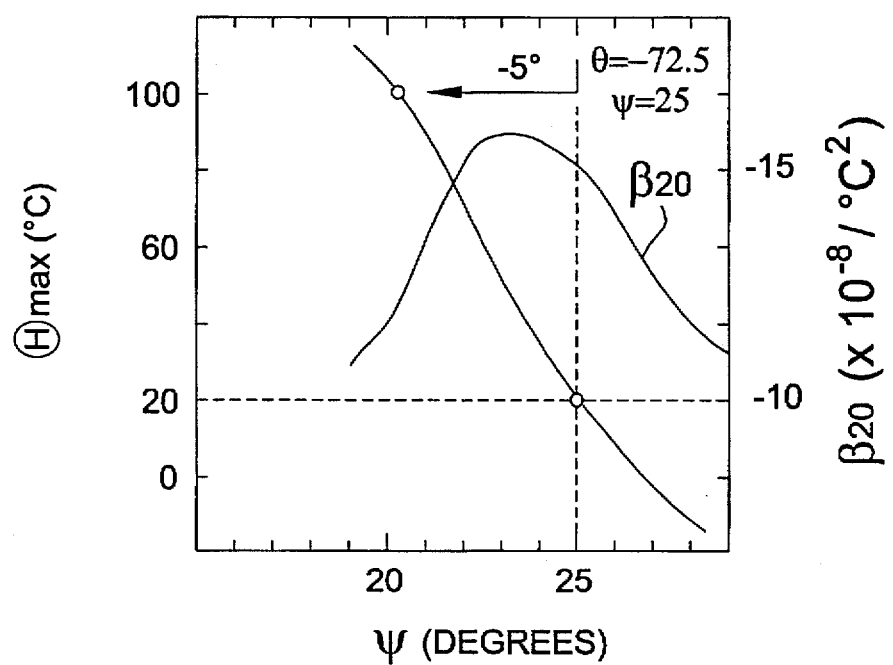
FIG. 11 is a graph showing the change of the top temperature $\Theta$max and secondary coefficient $\beta$ when the angle $\theta$ is $-72.5$ degrees and the angle $\psi$ is in the vicinity of 25 degrees.

FIG. 9 shows the Q values measured in the SAW resonator where the IDT and reflectors are arranged in the direction inclined by some angles δ against the propagation direction of the phase as described in FIG. 2 and FIG. 3. These SAW resonators are of a type where the resonance frequency is 150 MHz–170 MHz utilizing the crystal with below mentioned cut as the piezoelectric material Evident from FIG. 9, as the angle δ is increased, the Q value is significantly improved. There can be obtained a SAW resonator having a very high Q value of $2.5 \times 10^4$ in the vicinity of the angle δ of 5 degrees almost equal to the power flow direction SAW resonators were made where the phase propagates in the X' axis direction of (−72.5, 25) and (−72.5, 30) expressed by (θ, ψ) shown in FIG. 1, and the temperature characteristic was measured. Each resonator's frequency temperature characteristic obtained by this measurement is shown in FIG. 10. The change or the frequency temperature characteristics for the SAW resonator is calculated where the angle θ is set to the same degree and the angle ψ is changed in the vicinity of 25 degrees, and the results are shown in FIG. 11. In this calculation, the inclination of the energy propagating direction that is the power flow angle PFA is not taken into consideration. FIG. 11 shows the change of the temperature Θ max at the top of the frequency temperature characteristic curve for each resonator and the frequency secondary temperature coefficient β20 at 20° C. relative to the angle ψ.

Evident by comparing FIG. 10 and FIG. 11, the frequency temperature characteristic of the above mentioned SAW resonator where the actually measured angle ψ is 25 degrees, has the top temperature Θmax of 100° C., and this corresponds to the calculated result where the angle ψ is 20 degrees. The frequency temperature characteristic with the actually measured angle ψ being 30 degrees has the top temperature Θmax of 20° C., and this corresponds to the calculated angle ψ being 25 degrees. Thus, the calculated result seems to be deviated in the direction where the absolute value of the angle ψ is approximately 5-degree smaller than the actual measurement of the frequency temperature characteristics. On the other hand, it is known that according to the calculation the angle formed between the power flow angle and X' axis of the crystal piece is deviated in the direction where it is smaller than the angle ψ by the absolute value of 4.75 degrees, and this deviation turns out to be almost matched with the deviation of the frequency temperature characteristic. Judging from the above results, it seems as unverified idea that the frequency temperature characteristic can be realized by as much as the deviation of the power flow angle PFA. Thus, it can be considered that the propagation direction of the elastic surface waves indicating the zero temperature coefficient can be matched with the propagation direction of the energy if the in-plane angle ψ of rotation is set so that it is corrected by as much as the power flow angle. There can be provided a SAW resonator which presents a suitable frequency temperature characteristic in the main operating temperature range and which has the stable oscillations.

Figure 12:
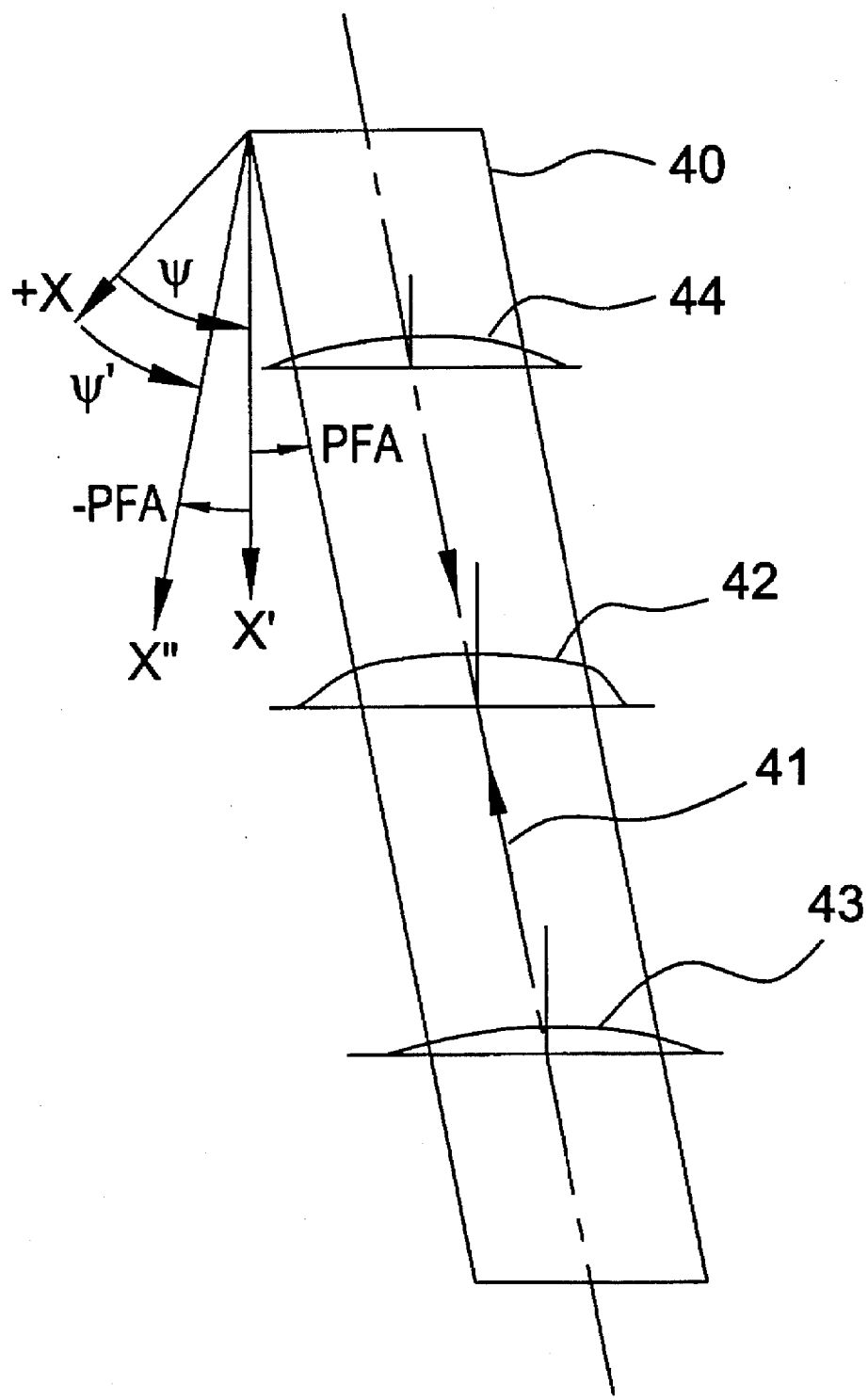
FIG. 12 is a diagram showing a conceptual idea for determining the orientation with the power flow angle being corrected.

FIG. 12 shows the general IDT configuration in which the power flow angle PFA is taken in the + direction. First of all, the propagation direction of the elastic surface waves on the crystal piece is set to the X" axis. The X" axis is an axis obtained by rotating the electric axis and X axis of the crystal by the angle ψ", and the angle ψ" is expressed by the following equation.

$$\psi' = \psi - PFA \tag{3}$$

And, an electrode forming region 40 where the IDT and reflectors previously described based on FIG. 2 are arranged is rotated in the direction of -PFA, and a PFA direction 41 is made to match with the direction indicating the zero temperature coefficient. The reference numerals 42, 43 and 44 in FIG. 12 indicate the displacement of the oscillation amplitude of the SAW resonator.

Such an idea described so far is not limited to the previously described temperature characteristics alone and it is speculated that such an idea can be applied to the orientation regarding other factors such as a stress sensitivity characteristic and short-term stability.

Selection of crystal piezoelectric material

Accordingly, the IDT and reflectors are arranged to cover the energy propagating direction of the elastic surface waves. As a result there can be obtained a SAW resonator having high resonance sharpness and a large Q value. Furthermore, much stable characteristic against the temperature is required in the resonator used for the mobile communication, etc. The SAW resonator utilizing the ST-cut crystal piece gets much attention as a stable oscillation source because its primary temperature coefficient α of the frequency temperature characteristic is zero. However, the secondary temperature coefficient β is relatively large as previously described. Thus, it is desirable to improve the temperature characteristic when it is used in a wide range of operating temperatures, for example, in the range or -20° C. to 80° C. In view of these requests, the inventor of this application found out that in the previously described method of constructing the SAW resonator there can be provided a SAW resonator whose frequency temperature characteristic is further excellent by newly combining the angle ψ in the range of approximately 40–47 degrees with the angle θ in the range of approximately 25–45 degrees utilizing the coordinate system previously shown in FIG. 1.

Figure 13:
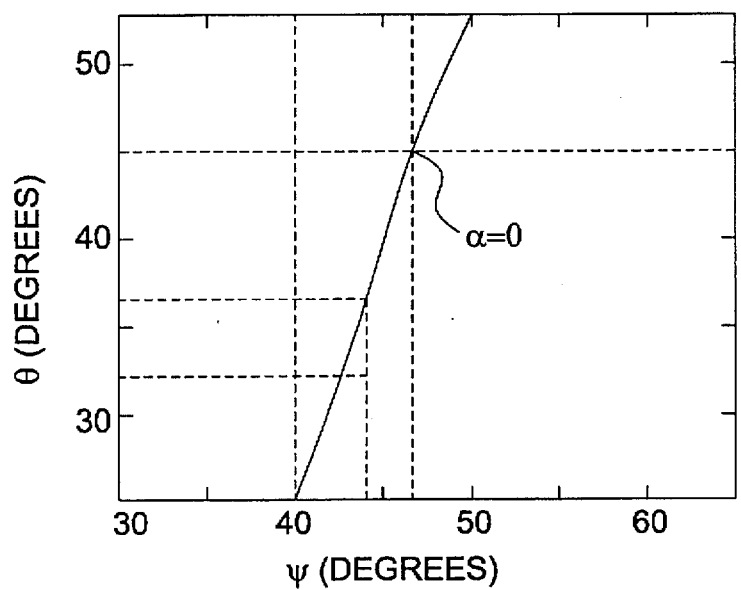
FIG. 13 is a graph showing the combination of angle $\theta$ and angle $\psi$ with the primary coefficient $\alpha$ showing zero, in the angle $\theta$ range of approximately 25–50 degrees.

FIG. 13 shows the range of combinations of the angle θ of rotation and angle ψ of rotation where the primary coefficient a of the frequency temperature characteristic becomes zero (α=0). α indicates the primary coefficient for the temperature T obtained in a manner that the frequency temperature characteristic curve is Taylor-expanded at an ordinary temperature of 20° C. as shown in the equation below.

$$\Delta f/f = \alpha(T-20) + \beta(T-20)^2 + \gamma(T-20)^3 \tag{4}$$

where Δf/f is a rate of change of the frequency at other temperature on the basis of the frequency of the SAW resonator at 20° C. In the SAW resonator utilizing the aluminum electrodes, the frequency temperature characteristic depends on the film thickness H of the aluminum electrode. Therefore, a SAW resonator with H/λ being in the desirable range of 0.02–0.04 as previously described is presupposed and indicated in FIG. 13.

Figure 14:
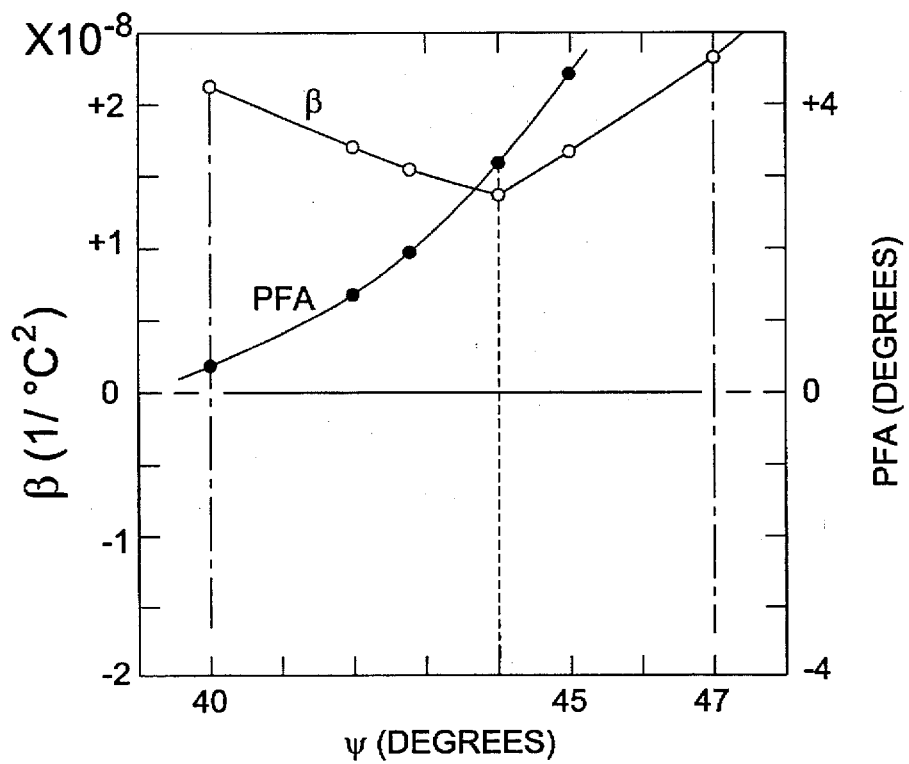
FIG. 14 is a graph showing the secondary coefficient $\beta$ for the resonator utilizing the combination shown in FIG. 13, and the change of power flow angle PFA.

Moreover, the secondary coefficient β of the temperature is measured in a manner that the in-plane angle ψ of rotation is changed in the SAW resonator where the primary coefficient α is zero. FIG. 14 shows the measurement result and power flow angle PFA. Evident from FIG. 14, the secondary coefficient B becomes less than $-2.5 \times 10^{-8}/°C^2$ when the angle ψ is in the range of approximately 40–47 degrees. In contrast to the fact that the secondary coefficient β of the conventional ST-cut SAW resonator is $-3.4 \times 10^{-8}/°C^2$, this is a low value that is less than ⅔ of the conventional value, and it is disclosed that the frequency temperature characteristic can be significantly improved. In the range of this angle ψ, the power flow angle PFA is close to 0 degree, and the energy confinement can be efficiently performed as previous described. Therefore, it is disclosed that the SAW resonator having a suitable frequency temperature characteristic and high Q value can be realized because there is utilized a crystal piece having the cutting orientation with the angle θ and angle ψ being in the range of approximately 25–45 and 40–47 degrees, respectively.

Moreover, the secondary coefficient β indicates the minimum value of approximately $-104 \times 10^{-8}/°C^2$ when the angle ψ is in the vicinity of 44 degrees, and this value is a very low one that is less than a half of that of the conventional ST-cut SAW resonator. The power flow angle PFA indicates a lower value as the angle ψ approaches 40 degrees. Therefore, it is desirable that in the above angle range and with the angle ψ being approximately 40–44 degrees, there be used a crystal piece having the cutting orientation with the angle θ being in the range of approximately 25–37 degrees corresponding thereto. There can be provided a SAW resonator having a very small time-elapsed change, because particularly in the crystal piece having the cutting orientation with the angle θ being 33±1 degrees and the angle ψ being 42.75±1 degrees an aluminum single crystal film having an excellent crystal orientation is obtained in the surface thereof. Therefore, it is further desirable to use a crystal piece having the cutting orientation including this range where the angle θ is in the range of approximately 32–37 degrees while the angle ψ is in the range of approximately 40–44 degrees. Utilizing the crystal piece having the cutting orientation with these angles θ and ψ, the secondary coefficient β becomes $-1.6 \times 10^{-8}/°C^2$ that is about a half of that of the conventional ST-cut SAW resonator, so that the frequency temperature characteristic can be improved very much. In the above-described angle range, the tertiary coefficient γ in the frequency temperature characteristic is less than $-1 \times 10^{-10}/°C^3$ that is a very small value.

Figure 15:
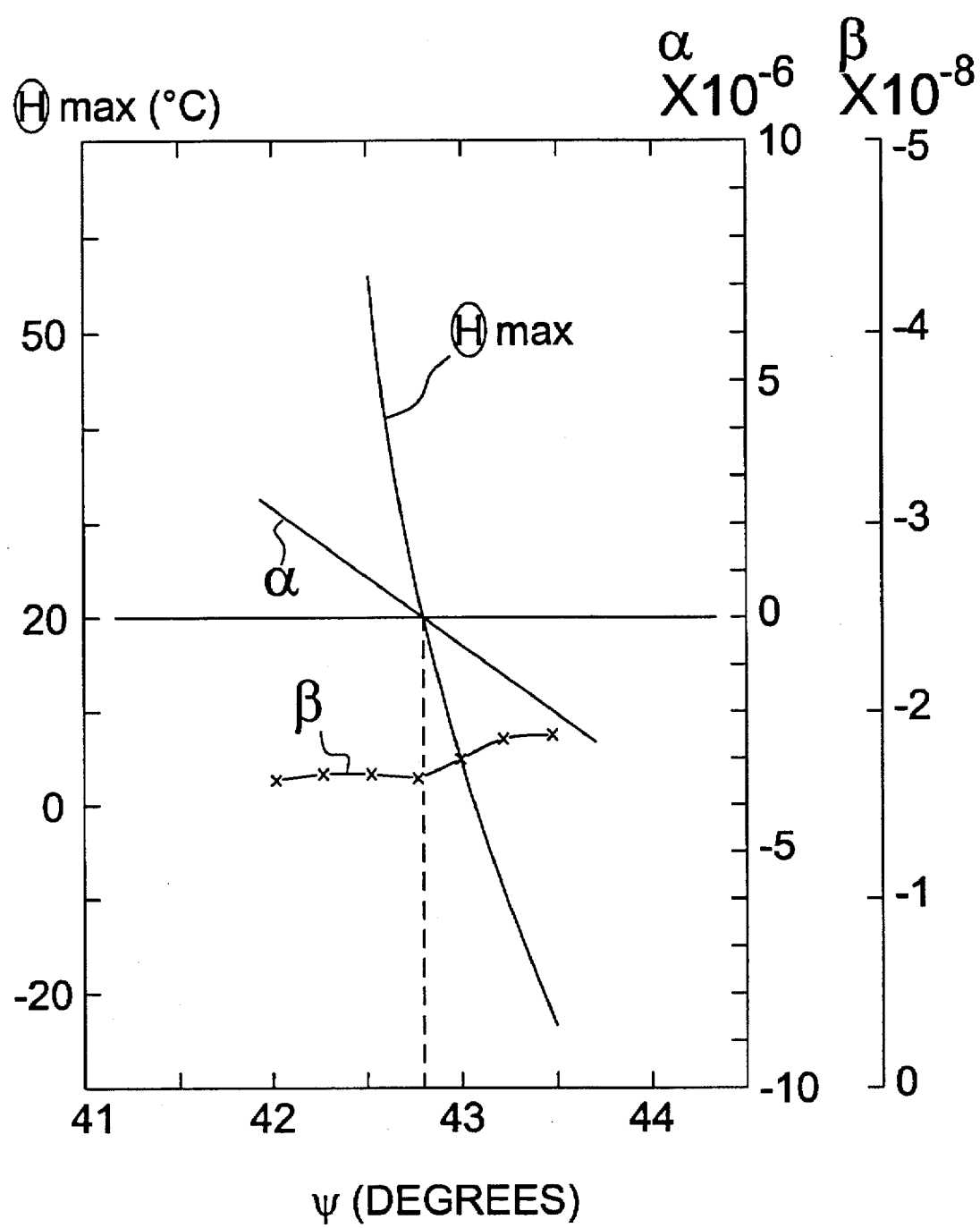
FIG. 15 is a graph showing the change against the angle ψ for the frequency temperature characteristics with the angle θ being 33 degrees in the combination of angles shown in FIG. 13.

FIG. 15 shows the calculation results of the primary temperature coefficient α, secondary temperature coefficient β and top temperature Θmax of the frequency temperature characteristic curve when the angle θ is set to 33 degrees and the angle ψ is changed in the range from 42 to 43.5 degrees. According to the calculation results, in the SAW resonator with the angle θ being 33 degrees and angle ψ being 42.75 degrees in the Θmax becomes in the neighborhood of the room temperature 20° C. However, the Q value indicating the resonance sharpness is low in the conventional SAW resonator where the inclination angle δ shown in FIG. 2 and FIG. 3 is not set. In contrast thereto, when an inclination angle δ is set and the value thereof is made approximately equal to the power flow angle PFA (185 degree), the Q value is improved more than twice as good. In order to obtain such a significant effect, it is desirable that the inclination angle δ is set to approximately ±1° of the power flow angle PFA. Moreover, the frequency temperature characteristic of the SAW resonator where the IDT and reflectors are inclined in view of the power flow angle PFA, indicates a low value of less than 50 ppm in the operating temperature range of -20° C. to 80° C.

Figure 16:
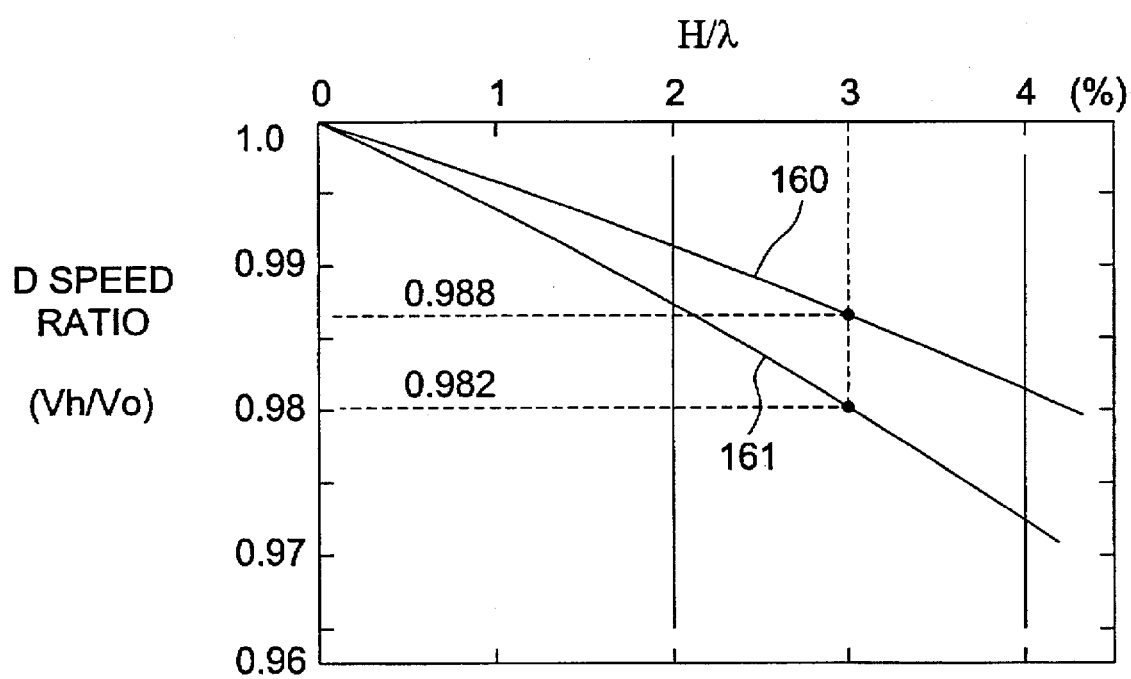
FIG. 16 is a graph showing the acoustic speed drop characteristics for the crystal piece of the angle combination shown in FIG. 13.

In order to realize the SAW resonator of the previously described energy confinement type utilizing the crystal piece having this cutting orientation, firstly it is necessary to obtain the reflection coefficient a of the elastic surface waves per electrode. Then, calculated is the phase velocity of the elastic surface waves propagating in the X' axis direction when the aluminum film with the film thickness H is formed on the entire surface of the crystal piece. The result thereof is indicated in FIG. 16 utilizing the ratio $D=Vh/V0$ of the phase velocity Vh at the film thickness H and the phase speed V0 at H=0 relative to H/λ. FIG. 16 also shows a calculation result 161 utilizing the conventional ST-cut crystal piece and a calculation result 160 utilizing the crystal piece of the above-described cutting orientation where θ is 33 degrees and ψ is 42.75 degrees.

The wavelength ψ of the elastic surface waves is almost identical to the period 2Pt (Pt being the pitch of the interleaved electrodes in IDT as described above), and presents a change rate of the phase velocity as indicated in FIG. 16, and the relation between the so-called velocity drop characteristic and the reflection coefficient a is expressed by the following equation.

$$a = K\{(1/D)^2 - 1\}/(4H/\lambda) \tag{5}$$

where $K=0.8271 \times SIN(\pi n)$, $n=La/Pt$. La indicates a breadth of a single interleaved electrode as described based on FIG. 7, and n becomes 0.5 if this electrode width La is equal to the space Lb between electrodes.

The equation (5) can be derived from the facts: The ratio of a free surface's acoustic impedance Zf and an acoustic impedance Zm at the time of forming film when expressing a propagation path of the elastic surface waves by the Mason equivalent circuit, is expressed as a ratio of square of each sound velocity as shown below $$Zm/Zf = D^2 \tag{6};$$

the reflection coefficient γ due to the acoustic impedance inconsistency is expressed by the following equation $$\gamma = (Zf - Zm)/(2Zm) \tag{7};$$

and, the reflection coefficients a and γ can be approximated by the following equation $$2aH/\lambda = b\gamma \times SIN(\pi n) \tag{8}.$$

The constant b is determined in the course of deriving the reflection coefficient a of the ST-cut resonator a (a=0.255), and the value (b=0.8271) is utilized.

In order to obtain the reflection coefficient a for the crystal piece of this example by utilizing the above (5) equation, substituted is D=0.988 which corresponds to H/λ=0.03 that is an appropriate value as H/λ, among the velocity ratio shown in FIG. 16. As a result, 0.1684 is obtained as the reflection coefficient a for the crystal piece of this example.

Next, as the energy-confinement type SAW resonator, the M pairs of the interleaved electrodes is obtained which is necessary in the course of obtaining the same level of total reflection coefficient (Γ=2.448) as the previously described ST-cut SAW resonator. By substituting the reflection coefficient a obtained above to the equation (1), 121.1 is obtained as the required number of pairs of electrodes M. Namely, the SAW resonator having the high Q value as described in the ST-cut crystal SAW resonator can be obtained if the M pairs of the interleaved electrodes constituting the IDT is in the level of 120 pairs. According to the present invention, there can be realized a SAW resonator having an excellent frequency characteristic and having a large Q value because the resonator of this example uses and is constructed by the piezoelectric material where the fluctuation of the frequency temperature characteristic is little.

In the SAW resonator, a parallel capacity value C0 in the oscillation circuit is usually below 6 pF. The capacity value C0 of the SAW resonator can be obtained from the following equations.

$$C0 = 1.95 \epsilon_0 \epsilon_r WcM \tag{9}$$

where $\epsilon_0$ is a dielectric constant in the vacuum and $\epsilon_r$ is a relative dielectric constant (the one for the crystal is approximately 4.43–4.63). Wc is the width dimension of the IDT in the direction orthogonal to the phase propagating direction, and it is desirable that Wc/λ lies within the range of approximately 35–40 in view of excitation of the spurious vibration in the width direction. As a result, the maximum value of the M is in the level of 300. It is desirable that, as described above, the range of H/λ is in the range of approximately 0.02–0.04 in view of the capacity C0 and the processability of an electrode pattern.

Furthermore, as for a SAW resonator also having a cutting orientation in the vicinity of the K cut which is proposed as a cutting orientation excellent in the short-term stability of the frequency, the inventor of this application confirmed the frequency temperature characteristic thereof and found out various conditions necessary to put into practice the SAW resonator having a high Q value and having the excellent short-term stability of the frequency.

Figure 17:
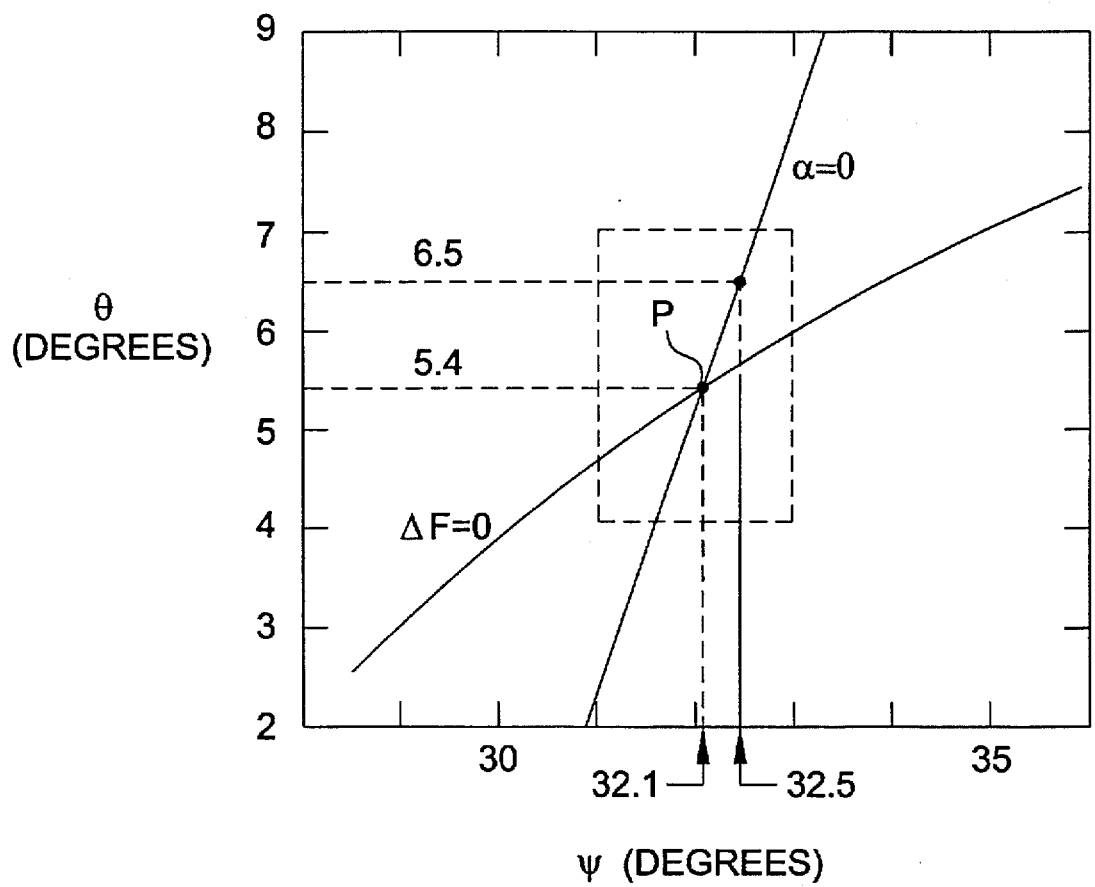
FIG. 17 is a graph showing the combination of angle θ and angle ψ with the primary coefficient α indicating zero, in the angle θ range of approximately 2–9 degrees, and showing the locus of ΔF=0.

FIG. 17 shows the combinations in which the primary coefficient α of the frequency temperature characteristic becomes 0 in the vicinity of the K cut i.e. in the range of angle θ being 2–9, among the combinations of angle θ and angle ψ shown in FIG. 1. FIG. 17 also shows the combinations of angle θ and angle ψ such that a quantity ΔF of an instantaneous frequency shift shows zero when a laser beam is irradiated to the SAW resonator. Evident from FIG. 17, the curve showing the combination in which the primary coefficient α becomes zero (α=0) crosses the curve showing the combination in which the quantity ΔF of the frequency shift becomes zero (ΔF=0), at a point P where the angle θ is 5.4 degrees and the angle ψ is 32.1 degrees. Therefore, in the crystal piece having these angles as the cutting orientation, the quantity of the frequency shift will be zero at the zero temperature coefficient. In the vicinity of this point P, that is, in the range of the angle θ being 4–7 degrees and the angle ψ being 31–33 degrees, the combination of the angle θ and angle ψ is experimentally obtained such that the primary coefficient α becomes zero. Theses combinations can be approximated by the following equation.

$$\theta = 2.775 \times (\psi - 32.5) + 6.5 \tag{10}$$

Figure 18:
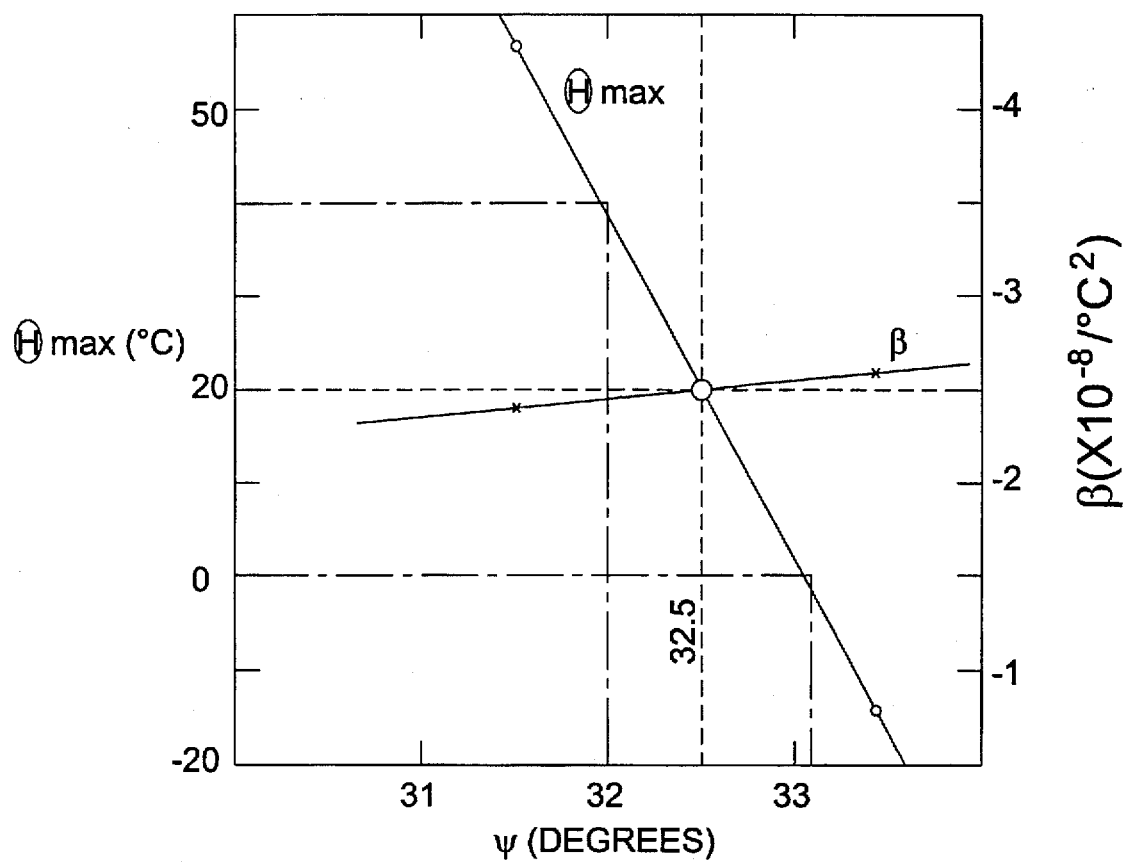
FIG. 18 is a graph showing the change of the secondary coefficient β and the top temperature Θmax utilizing the angle combination shown FIG. 17.

In FIG. 18 the temperature Θmax indicating the top of the frequency temperature characteristic curve and the change of the secondary coefficient β of the frequency temperature characteristic in the crystal piece where the angle θ is 6.5 and the angle ψ is set in the neighborhood of 32.5 degrees, among angles θ and ψ satisfying the equation (10). Evident from FIG. 18, in order that the temperature Θmax indicating the top of the frequency temperature characteristic curve shall lie in the usual usage condition of 20±20° C. among the operating temperature range, it is necessary that an allowable value of the angle ψ is set to ±30 minutes. Referring to FIG. 18, the secondary coefficient β of the frequency temperature characteristic is in the range of $-2.4 \times 10^{-8}/°C.^2$ to $-2.7 \times 10^{-8}/°C.^2$ that is a low value and that is ⅔ of the secondary coefficient β of the conventional ST cut (−3.4× $10^{-8}$/°C.$^2$). In particular, the secondary coefficient β is −2.5×$10^{-8}$/°C.$^2$ when the orientation (θ, ψ) is (6.5, 32.5) and (5.4, 32.1).

Figure 19:
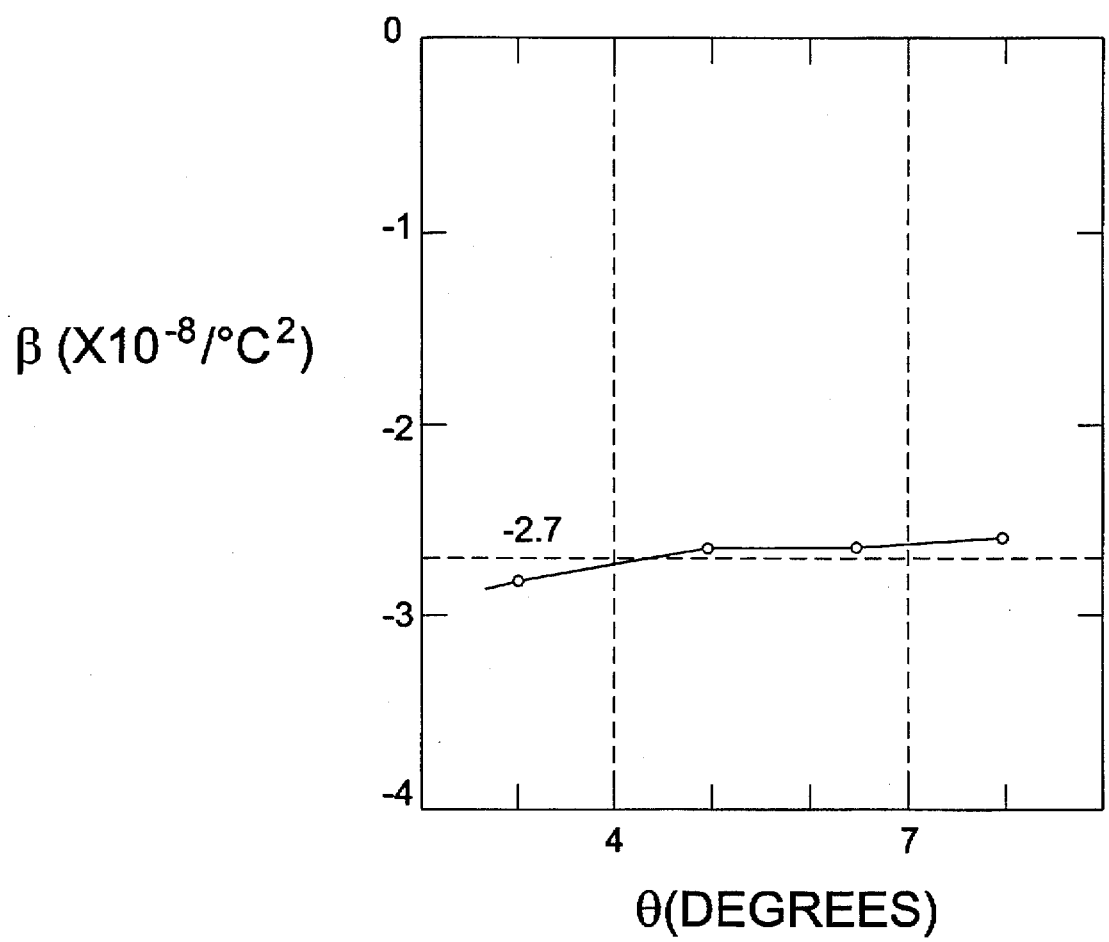
FIG. 19 is a graph showing the correlation between the secondary coefficient β and angle θ.

FIG. 19 shows the change of the secondary coefficient β of the crystal piece where the angle θ and angle ψ satisfies the relation indicated in the equation (10). Evident from FIG. 19, the secondary coefficient β takes a satisfactory value of mostly less than −2.5×$10^{-8}$/°C.$^2$ in the range of angle θ being approximately 4–7 degrees. Therefore, there can be constructed a SAW resonator where the temperature characteristic is improved and the short-term stability is very high, if the angle θ and the angle ψ satisfies the equation (10) and the angle θ is in the range of approximately 4–7 degrees. The allowable value of the angle θ may be in the level of ±1 because the fluctuation of the secondary coefficient β is very little and stable within this range.

Figure 20:
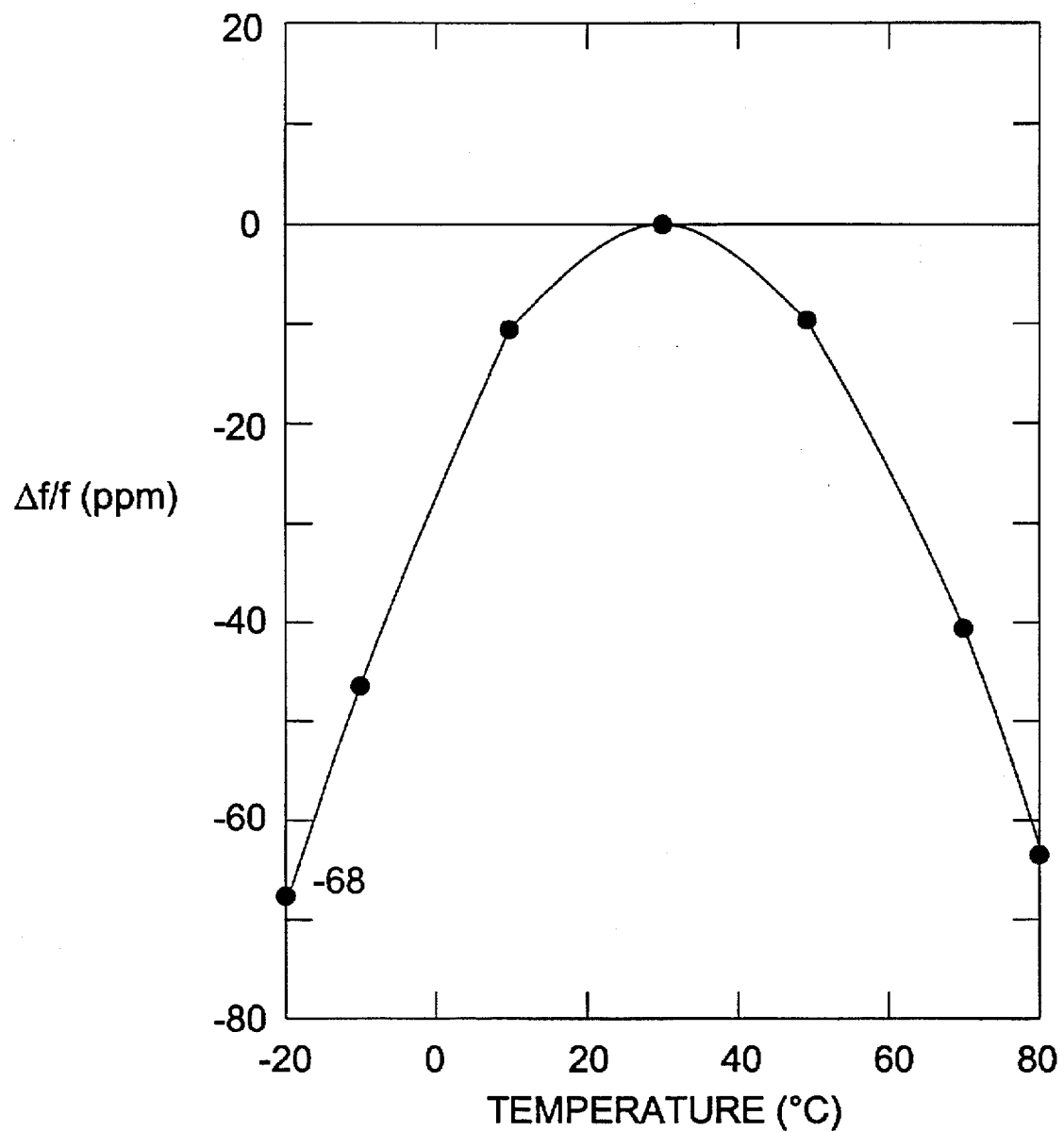
FIG. 20 is a graph showing a frequency temperature characteristic example for a resonator utilizing the angle combination shown in FIG. 17.

FIG. 20 shows an example of the actually measured values for the frequency temperature characteristics of the SAW resonator produced by utilizing the crystal piece of the cutting orientation according to this example. Evident from FIG. 20, the frequency change rate indicates a small value of 68 ppm over the operating temperature range of −20° C. to 80° C., so that there can be obtained a SAW resonator in which the frequency temperature characteristic is improved.

Figure 21:
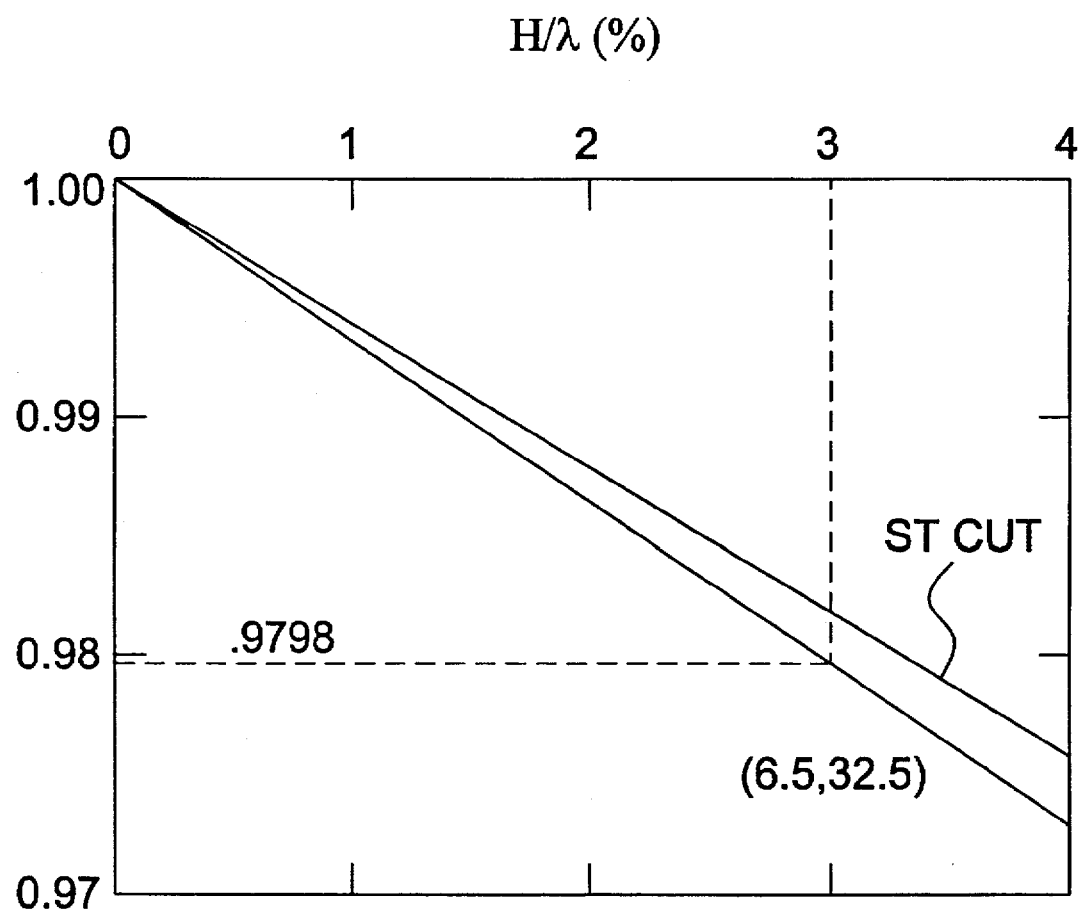
FIG. 21 is a graph showing the acoustic speed drop characteristics for the crystal piece of the angle combination shown in FIG. 17.

Next, in order to determine design conditions for the SAW resonator utilizing the crystal piece according to this example, the reflection coefficient a of the elastic surface waves for a single interleaved electrode of the IDT is obtained in a similar manner as the above-mentioned method. In FIG. 21, the calculation results of the phase velocity of the elastic surface waves propagating in the X' axis direction of the crystal piece having the cutting orientation according to this example is indicated utilizing the velocity ratio D. In FIG. 21 the velocity ratio D of angle θ being 6.5 degrees and angle ψ being 32.5 degrees as a combination of the cut angles among the cutting orientation according to this example is shown together with the velocity ratio of the crystal cut. The phase speed V0 of the angle θ being 6.5 degrees and angle ψ being 32.5 degrees with the electrode film thickness H being 0 is 3308.2 m/s.

Utilizing the change rate D=0.9798 of the phase speed when the ratio H/λ of the electrode film thickness H and wavelength λ is 0.03, the reflection coefficient of the crystal piece used in this example is calculated from the equation (5) and the reflection coefficient a is obtained as 0.2871. When the M pairs of the interleaved electrodes is calculated as the total reflection coefficient (Γ=2.448) to a same degree where the same level of energy confinement as the crystal-cut SAW resonator is obtained, the number of M is 71. Thereby if the IDT is provided utilizing the crystal piece according to this example where the M pairs of the interleaved electrodes is greater than 71, there can be realized a SAW resonator which has a high Q value and excellent frequency temperature characteristic and which presents an excellent short-term stability. Since, similar to the above case, the parallel capacity value C0 of the SAW resonator is less than 6 pF, the maximum value of the number of pairs of electrodes M is in the level of 300 pairs.

Figure 22:
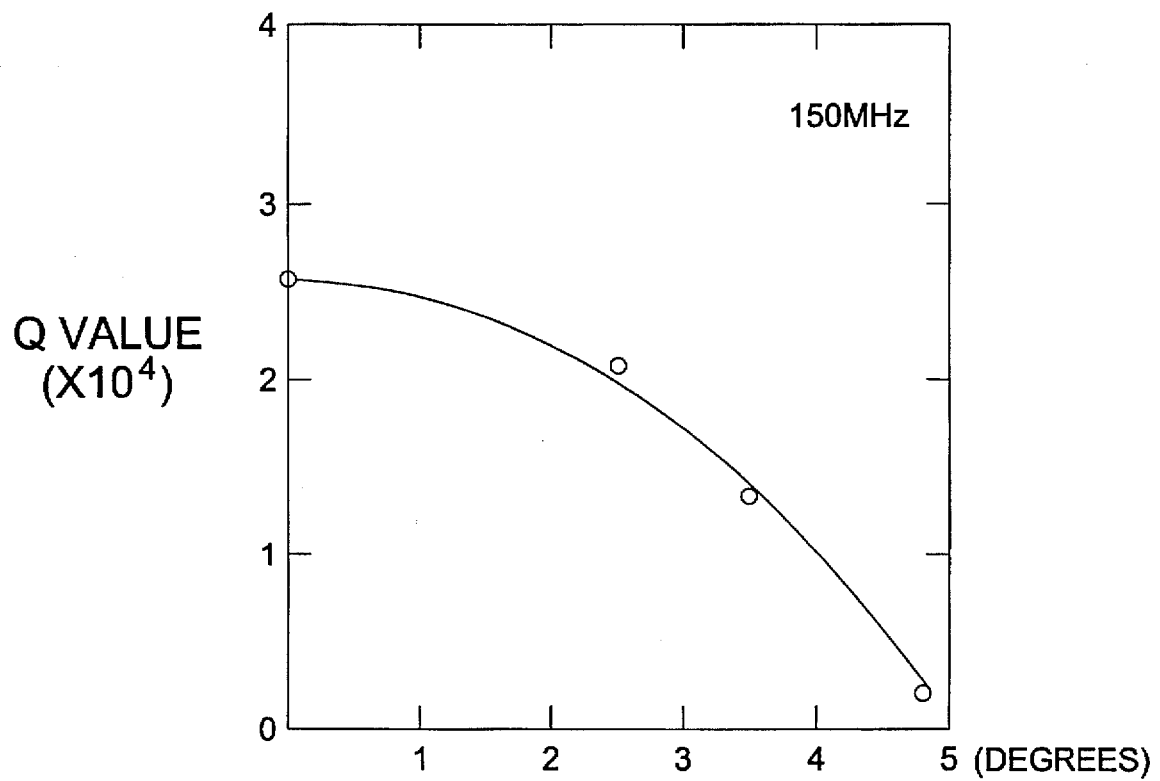
FIG. 22 is a graph showing the correlation between the electrodes' deviation from PFA in the arrangement direction, and the Q value.

Thus, the design conditions for the SAW resonator utilizing the crystal piece of this example was found out. By arranging the IDT and reflector in view of the power flow angle described based on FIG. 2 or FIG. 3, a SAW resonator having a high Q value can be provided. The influence of the power flow angle utilizing the cutting orientation of this example is shown in FIG. 22. FIG. 22 illustrates that, in the case where the IDT and reflector are arranged without taking the power flow angle into consideration as in the conventional SAW resonator, the drastic reduction of the Q value is measured as the electrode-arranged direction is, deviated further from the power flow angle PFA.

Figure 23:
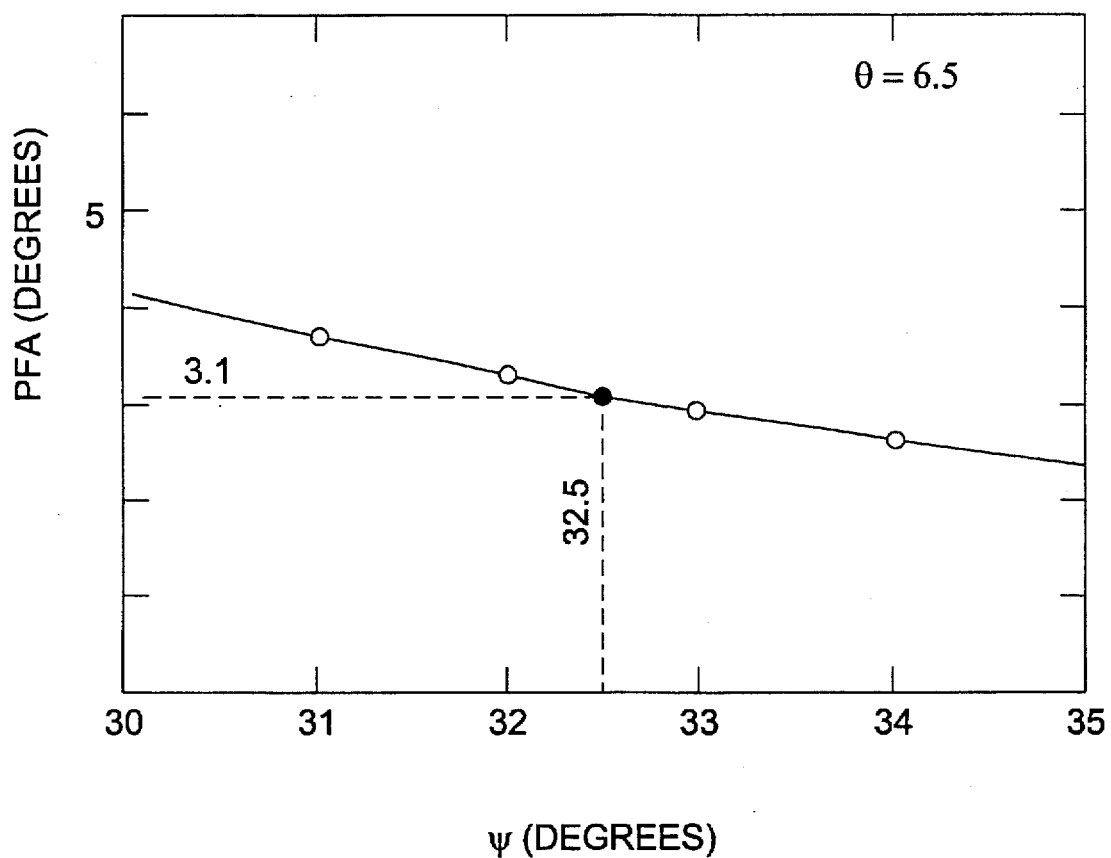
FIG. 23 is a graph showing the correlation between PFA and angle ψ.

FIG. 23 shows the power flow angle PFA when the angle ψ is varied in the range from 30 degrees to 35 degrees with the angle θ being 6.5 degrees. The power flow angle is 3.1 degrees when the angle θ is 6.5 degrees and angle ψ is 32.5 degrees. Different from this example, the power flow angle is 3.2 degrees when the angle θ is 5.4 degrees and angle ψ is 32.1 degrees. As shown in FIG. 22, when the electrode-arranged direction is moved or inclined by the angle δ relative to the phase-propagating direction and the difference between this moved angle δ and the power flow angle PFA is in the level of ±1°, a very high Q value can be obtained similar to the case where the moved angle δ is matched with the power flow angle PFA. When the difference between this moved angle δ and the power flow angle PFA is in the level of ±3°, a high Q value which is several times higher than the conventional one can be obtained even though the Q value is reduced by about a half. Evident from the figures, even though the moved angle is not in these angle ranges, setting a slightly inclined angle in the power flow angle PFA direction by the moved angle δ will improve the Q value.

In the SAW resonator in which the IDT and reflector are arranged taking into consideration the power flow angle for the crystal piece having the cutting orientation with combination of angles θ and ψ as shown in the above examples, there can be formed, for example, a SAW resonator having equivalent constants where the Q value is 20000 in the resonance frequency of 152 MHz, the equivalent series resistance is 15Ω, the equivalent series capacitance is 3.2 pF and the capacity ratio is in the level of 1700. These values are same as or greater than those of the conventional ST-cut SAW resonator, and the frequency temperature characteristic indicates a superior characteristic than that of the ST-cut SAW resonator as described above. Moreover, the SAW resonator of this example is also superior in the short-term stability of the frequency, and the value of the Allen dispersion with the sample period τ being 2 seconds is approximately 3×$10^{-8}$, and this shows that the stability thereof is better by a factor of approximately one digit compared to the ST-cut SAW resonator (approximately 1.3×$10^{-8}$).

Though have been described based on a single port type SAW resonator in the above examples, a two port type will do also. Moreover, the arrangement of the IDT and reflector taking the power flow angle into consideration is not limited to the SAW resonator where quartz is utilized as the piezoelectric material, it of course can be applied to SAW resonators utilizing other piezoelectric material elements such as LiTaO$_3$, LiNbO$_3$, etc. The present invention is not limited to the SAW resonator but it can also be applied to a SAW filter and other SAW devices, thus being able to provide the SAW device having a high resonance sharpness and an excellent temperature characteristic. As for a holder storing the SAW resonator according to the present invention, it may be a cylindrical-shape container or a flat type metal container, and it may be of course a container of the ceramic surface-packaged type.

What is claimed is:

1. A SAW device, comprising:
    a plate-type piezoelectric material;
    an interdigital transducer comprising M pairs of interdigital transducer electrodes made of a conductor having a film thickness H, the transducer electrodes being disposed on the plate-type piezoelectric material such that they are parallel to one another and extend in a direction substantially orthogonal to a first direction corresponding to a phase propagation direction;

first and second reflectors disposed on the plate-type piezoelectric transducer at opposite ends of the interdigital transducer, the first and second reflectors comprise a plurality of reflector conductors that extend in a direction substantially parallel to the transducer electrodes; and a width of the reflector conductors extending substantially orthogonal to the first direction and being greater than a width of the transducer electrodes and all reflector conductors intersecting a first line extending in a direction that approximately corresponds to a power flow direction, the first line approximately positioned at a distal extent of said interdigital transducer electrodes in a third direction approximately perpendicular to said power flow direction, and all reflector conductors intersecting a second line extending in a direction that approximately corresponds to a power flow direction, the second line approximately positioned at a distal extent of said interdigital transducer electrodes in a fourth direction opposite said third direction.

2. A SAW device according to claim 1, the ends of said interdigital transducer electrodes and reflector conductors being substantially aligned with the second direction.

3. A SAW device according to claim 1 the transducer electrodes and reflector conductors extending in a direction substantially orthogonal to the first direction.

4. A SAW device according to claim 1, an angle formed between the first direction and the second direction being approximately within ±1 degree of the power flow angle.

5. A SAW device according to claim 1, an angle formed between the first direction and the second direction being approximately within ±3 degrees of the power flow angle.

6. A SAW device according to claim 1, wherein, if the reflection coefficient of elastic surface wave per said interdigital transducer electrode is denoted as a, the total reflection coefficient of said interdigital transducer electrodes expressed by $\Gamma=4\times M\times a\times H/\lambda$ is in the range of approximately 0.8 through 10, where $\lambda$ is the wavelength of the elastic surface waves, and a pitch of the reflector conductors being greater than a pitch of said interdigital transducer electrodes, a reflection center frequency of said reflector being approximately equal to a frequency at which the maximum radiation conductance is obtained, and a distance between end transducer electrodes of the interdigital transducer and the adjacent reflector conductors of the first and second reflectors being approximately equal to the space Lb of the transducer electrodes.

7. A SAW device according to claim 6, a ratio Nr/M of the number of the reflector conductors Nr to the number of pairs of said interdigital transducer electrodes M being in the range of approximately 1.5 to 2.

8. A SAW device comprising:

a plate-type piezoelectric material;

an interdigital transducer having M pairs of interdigital transducer electrodes made of a conductor having a film thickness H disposed in parallel lines that extend in a direction that is substantially orthogonal to a first direction of a surface of said piezoelectric material; and first and second reflectors, disposed at first and second ends, respectively, of the interdigital transducer, each of the first and second reflectors having a plurality of reflector conductors disposed parallel to the interdigital transducer electrodes, said piezoelectric material being a plate of α quartz single crystal having a planar surface that is rotated about an electrical axis X from a plane that is perpendicular to the mechanical axis Y in the counterclockwise direction by an angle θ of approximately 25–45 degrees, and an absolute value of an angle ψ formed between the first direction and the electrical axis X being approximately 40–47 degrees.

9. A SAW device according to claim 8, the angle θ being in the range of approximately 25–37 degrees, and the absolute value of the angle ψ being in the range of approximately 40–44 degrees.

10. A SAW device according to claim 8, the angle θ being in the range of approximately 32–37 degrees, and the absolute value of the angle ψ being in the range of approximately 40–44 degrees.

11. A SAW device according to claim 8, the angle θ being 33±1 degrees, and the absolute value of the angle ψ being 42.7±1 degrees.

12. A SAW device according to claim 8, at least part of said interdigital transducer electrodes and reflector conductors being disposed in a second direction which intersects with the first direction.

13. A SAW device according to claim 12, the angle θ being in the range of approximately 25–37 degrees, and the absolute value of the angle ψ being in the range of approximately 40–44 degrees.

14. A SAW device according to claim 12, the angle θ being in the range of approximately 32–37 degrees, and the absolute value of the angle ψ being in the range of approximately 40–44 degrees.

15. A SAW device according to claim 12, the angle θ being 33±1 degrees, and the absolute value of the angle ψ being 42.7±1 degrees.

16. A SAW device according to claim 12, an angle formed between the first direction and the second direction being approximately within ±1 degree of the power flow angle.

17. A SAW device according to claim 12, an angle formed between the first direction and the second direction being approximately within ±3 degrees of the power flow angle.

18. A SAW device according to claim 12, the angle θ being 33±1 degrees, the absolute value of the angle ψ being 42.7±1 degrees, and the power flow angle being 1.85±1 degrees, and an angle formed between the first direction and the second direction being approximately within ±1 degree of the power flow angle.

19. A SAW device according to claim 8, wherein, if the reflection coefficient of elastic surface wave per said interdigital transducer electrode is denoted as a, the total reflection coefficient of said interdigital transducer electrodes expressed by $\Gamma=4\times M\times a\times H/\lambda$ is in the range of approximately 0.8 through 10, where $\lambda$ is the wavelength of the elastic surface waves, a pitch of the reflector conductors being wider than a pitch of said interdigital transducer electrodes, a reflection center frequency of said reflector being approximately equal to a frequency at which the maximum radiation conductance is obtained, and the distances between the end transducer electrodes of the interdigital transducer and adjacent reflector conductors of the first and second reflectors being approximately equal to the space Lb of the transducer electrodes.

20. A SAW device according to claim 19, a ratio Nr/M of the number of the reflector conductors Nr to the number of pairs of said interdigital transducer electrodes M being in the range of approximately 1.5 to 2.

21. A SAW device according to claim 19, said interdigital transducer electrodes being formed of aluminum metal film, and a ratio H/λ of the film thickness H to the wavelength λ of the elastic surface wave being in the range of approximately 0.02 to 0.04.

22. A SAW device according to claim 19, the number of pairs of said interdigital transducer electrodes M being in the range of approximately 120 to 300.

23. A SAW device comprising:

a plate-type piezoelectric material;

an interdigital transducer having M pairs of interdigital transducer electrodes made of a conductor having a film thickness H disposed in parallel lines that extend in a direction substantially orthogonal to a first direction of a surface of said piezoelectric material; and first and second reflectors, disposed at first and second ends, respectively, of the interdigital transducer each of the first and second reflectors having a plurality of reflector conductors disposed parallel to the interdigital transducer electrodes, said piezoelectric material being a plate of α quartz single crystal having a planar surface that is rotated about an electrical axis X from a plane that is perpendicular to the mechanical axis Y in the counterclockwise direction by an angle θ of approximately 4–7 degrees, and an absolute value of an angle ψ formed between the first direction and the X axis being related to the angle θ, in the range where ψ varies ±30 minutes, such that θ=2.775×(ψ−32.5)+6.5(degrees).

24. A SAW device according to claim 23, at least part of said interdigital transducer electrodes and reflector conductors being disposed in a second direction which intersects with the first direction.

25. A SAW device according to claim 24, an angle formed between the first direction and the second direction being approximately within ±1 degree of the power flow angle.

26. A SAW device according to claim 24, an angle formed between the first direction and the second direction being approximately within ±3 degrees of the power flow angle.

27. A SAW device according to claim 24, the angle θ being 6.5±1 degrees, the absolute value of the angle ψ being 32.5±1 degrees, and the power flow angle being 3.1±1 degrees, and an angle formed between the first direction and the second direction being approximately within ±1 degree of the power flow angle.

28. A SAW device according to claim 24, the angle θ being 6.5±1 degrees, the absolute value of the angle ψ being 32.5±1 degrees, and the power flow angle being 3.1±1 degrees, and an angle formed between the first direction and the second direction being approximately within ±3 degrees of the power flow angle.

29. A SAW device according to claim 24, the angle θ being 5.4±1 degrees, the absolute value of the angle ψ being 32.1±1 degrees, and the power flow angle being 3.2±1 degrees, and an angle formed between the first direction and the second direction being approximately within ±1 degree of the power flow angle.

30. A SAW device according to claim 24, the angle θ being 5.4±1 degrees, the absolute value of the angle ψ being 32.1±1 degrees, and the power flow angle being 3.2±1 degrees, and an angle formed between the first direction and the second direction being approximately within ±3 degrees of the power flow angle.

31. A SAW device according to claim 23, wherein, if the reflection coefficient of elastic surface wave per said interdigital transducer electrode is denoted as a, the total reflection coefficient of said interdigital transducer electrodes expressed by Γ=4×M×a×H/λ is in the range of approximately 0.8 through 10, where λ is the wavelength of the elastic surface waves, a pitch of the reflector conductors being wider than a pitch of said interdigital transducer electrodes, a reflection center frequency of said reflector being approximately equal to a frequency at which the maximum radiation conductance is obtained, and the distances between the end transducer electrodes of the interdigital transducer and the adjacent reflector conductors of the first and second reflectors is approximately equal to the space Lb of the transducer electrodes.

32. A SAW device according to claim 31, a ratio Nr/M of the number of the reflector conductors Nr to the number of pairs of said interdigital transducer electrodes M being in the range of approximately 1.5 to 2.

33. A SAW device according to claim 31, said interdigital transducer electrodes being formed of aluminum metal film, and a ratio H/λ of the film thickness H to the wavelength λ of the elastic surface waves being in the range of approximately 0.02 to 0.04.

34. A SAW device according to claim 31, the number of pairs of said interdigital transducer electrodes M being in the range of approximately 71 to 300.

* * * * *